(12) United States Patent
Nakada et al.

(10) Patent No.: US 8,591,657 B2
(45) Date of Patent: Nov. 26, 2013

(54) SUBSTRATE PROCESSING APPARATUS AND METHOD OF MANUFACTURING SEMICONDUCTOR DEVICE

(75) Inventors: Takayuki Nakada, Toyama (JP);
Tomoyuki Matsuda, Toyama (JP);
Shinya Morita, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 890 days.

(21) Appl. No.: 12/548,752

(22) Filed: Aug. 27, 2009

(65) Prior Publication Data

US 2010/0055918 A1 Mar. 4, 2010

(30) Foreign Application Priority Data

Aug. 29, 2008 (JP) .................................. 2008-222061
Jul. 8, 2009 (JP) .................................. 2009-162263

(51) Int. Cl.
*C23C 16/00* (2006.01)

(52) U.S. Cl.
USPC .......................................................... 118/730

(58) Field of Classification Search
USPC ........................... 118/715, 722, 724, 728–730
See application file for complete search history.

(56) References Cited

U.S. PATENT DOCUMENTS

2005/0175952 A1 8/2005 Toba et al.

FOREIGN PATENT DOCUMENTS

| JP | 06-168904 | 6/1994 |
| JP | 2003-258063 | 9/2003 |
| JP | 2003-303776 | 10/2003 |

*Primary Examiner* — Maureen Gramaglia
(74) *Attorney, Agent, or Firm* — Brundidge & Stanger, P.C.

(57) ABSTRACT

Metal corrosion and substrate contamination can be suppressed, and process quality and yield can be improved. A substrate processing apparatus comprises: a process chamber; a substrate holder; a cover part closing and opening the process chamber; a substrate holder stage; a rotary mechanism rotating the substrate holder stage; a rotation shaft inserted through the cover part and connected to the substrate holder stage and the rotary mechanism so that a first gas ejection port is formed therebetween; a first gas stagnant part surrounded by the rotary mechanism, the cover part, and the rotation shaft; a second gas ejection port formed at the substrate holder stage; a second gas stagnant part formed at the rotation shaft and communicating with the process chamber via the second gas ejection port; and a flow port formed at the rotation shaft for connecting the first and second gas stagnant parts.

7 Claims, 10 Drawing Sheets

A - A
CROSS-SECTION

A-A CROSS-SECTION

SUBSTRATE PROCESSING APPARATUS AND METHOD OF MANUFACTURING SEMICONDUCTOR DEVICE

CROSS-REFERENCE TO RELATED PATENT APPLICATION

This U.S. non-provisional patent application claims priority under 35 U.S.C. §119 of Japanese Patent Application Nos. 2008-222061, filed on Aug. 29, 2008, and 2009-162263, filed on Jul. 8, 2009, in the Japanese Patent Office, the entire contents of which are hereby incorporated by reference.

BACKGROUND OF THE INVENTION

1. Field of the Invention

The present invention relates to a substrate processing apparatus and a method of manufacturing a semiconductor device, which are adapted to manufacture a semiconductor device by performing processes such as a thin film forming process, an oxidation process, an impurity diffusion process, an annealing process, a chemical vapor deposition (CVD) process, and an etching process on a substrate such as a silicon wafer.

2. Description of the Prior Art

As a substrate processing apparatus, there is a batch type substrate processing apparatus capable of processing a predetermined number of substrates at a time. In a batch type substrate processing apparatus, a desired process is performed by charging a predetermined number of substrates in a substrate holder, loading the substrate holder into a process furnace, and introducing process gas into the process furnace in a state where the substrates are heated.

An exemplary batch type substrate processing apparatus is disclosed in Patent Document 1.

The substrate holder (boat) is placed on a furnace port cover (seal cap) that is used for air-tightly closing a furnace port. By lifting the seal cap using a lift unit (boat elevator), the boat can be loaded into the process furnace. During a process, the boat is rotated by a boat rotary mechanism so that process quality can be uniformly maintained.

In the process furnace, the boat is simply supported only by the seal cap. Therefore, if a transversal force is applied to the boat due to, for example, an earthquake, the boat may fall down. Particularly, if the boat falls down during a loading or unloading work or when the boat is placed outside the process furnace, the falling of the boat becomes a significant accident by which the operation time of the substrate processing apparatus is largely affected: for example, the substrate processing apparatus cannot be operated for a long time.

For this reason, in another substrate processing apparatus, a boat is mechanically shackled on a seal cap for preventing falling of the boat. In the case of a process furnace of such a substrate processing apparatus, a mechanically strong metallic material is used for making a boat fixing part and a boat fixing unit. The fixing part and fixing unit are configured to be loaded into the process furnace together with a boat.

In a substrate processing process such as a film forming process, for example, if a corrosive gas (e.g., chlorine (Cl)-containing gas) is used or etching is performed by using a corrosive gas, the fixing part and the fixing unit may be corroded, and thus substrates may be contaminated.

In the related art, a metallic part is covered with a quartz member so as not expose the metallic part directly to the inside of a furnace. However, eventually, metal corrosion occurs due to corrosive gas permeated through a narrow gap.

[Patent Document 1] Japanese Unexamined Patent Application Publication No. 06-168904.

SUMMARY OF THE INVENTION

An object of the present invention is to provide a substrate processing apparatus configured to suppress corrosion of metallic parts of the periphery of a substrate holder stage, prevent substrate contamination, and increase process quality or yield.

According to an aspect of the present invention, there is provided a substrate processing apparatus including: a process chamber configured to process a substrate; a substrate holder configured to hold the substrate; a cover part having a first penetration hole extending from an inside to an outside of the process chamber, the cover part configured to close and open the process chamber while loading and unloading the substrate holder into and from the process chamber; a substrate holder stage whereon the substrate holder is placed, wherein at least a portion of the substrate holder stage is made of a metal; a rotary mechanism installed at a side of the cover part opposite to the process chamber so as to rotate the substrate holder stage; a rotation shaft inserted through the first penetration hole and connected to the substrate holder stage and the rotary mechanism; a first gas ejection port defined by an inner circumferential surface of the cover part and the rotation shaft; a first gas stagnant part surrounded by the rotary mechanism, the rotation shaft and the cover part, the first gas stagnant part communicating with the process chamber via the first gas ejection port; a second gas ejection port comprising at least a second penetration hole extending from a surface of the substrate holder stage whereon the substrate is placed to an opposite surface thereof facing the rotary mechanism; a second gas stagnant part disposed at the rotation shaft and communicating with the process chamber via the second gas ejection port; and a flow port disposed at the rotation shaft, the flow part connecting the first gas stagnant part and the second gas stagnant part, wherein a ratio of a volume of the second gas stagnant part to that of the second gas ejection port is equal to or greater than a ratio of a volume of the first gas stagnant part to a sum of volumes of the first gas ejection port and the flow port.

According to another aspect of the present invention, there is provided a substrate processing apparatus including: a process chamber configured to process a substrate; a substrate holder configured to hold the substrate; a cover part having a first penetration hole extending from an inside to an outside of the process chamber, the cover part configured to close and open the process chamber while loading and unloading the substrate holder into and from the process chamber; a substrate holder stage whereon the substrate holder is placed, wherein at least a portion of the substrate holder stage is made of a metal; a rotary mechanism installed at a side of the cover part opposite to the process chamber so as to rotate the substrate holder stage; a rotation shaft inserted through the first penetration hole and connected to the substrate holder stage and the rotary mechanism; a first gas ejection port defined by an inner circumferential surface of the cover part and the rotation shaft; a first gas stagnant part surrounded by the rotary mechanism, the cover part and the rotation shaft, the first gas stagnant part communicating with the process chamber via the first gas ejection port; a second gas ejection port comprising at least a second penetration hole extending from a surface of the substrate holder stage whereon the substrate is placed to an opposite surface thereof facing the rotary mechanism; a second gas stagnant part disposed at the rotation shaft and communicating with the process chamber via the second gas ejection port; and a flow port disposed at the rotation shaft, the flow part connecting the first gas stagnant part and the second gas stagnant part.

According to another aspect of the present invention, there is provided a method of manufacturing a semiconductor device by using the substrate processing apparatus provided according to the aspect of the present invention, the method comprising: a process of placing the substrate holder in which a substrate is held on the substrate holder stage, loading the substrate holder into the process chamber, and closing the process chamber by using the cover part; and a process of processing the substrate in the process chamber by rotating the substrate holder by rotating the rotation shaft using the rotary mechanism, supplying gas to an inside of the first gas stagnant part, ejecting some of the gas supplied to the inside of the first gas stagnant part into the process chamber through the first gas ejection port, and ejecting at least the rest of the gas supplied to the first gas stagnant part into the process chamber through the flow port, the second gas stagnant part, and the second gas ejection port.

According to another aspect of the present invention, there is provided a method of manufacturing a semiconductor device by using the substrate processing apparatus provided according to the aspect of the present invention, the method comprising: a process of placing the substrate holder in which a substrate is held on the substrate holder stage, loading the substrate holder into the process chamber, and closing the process chamber by using the cover part; and a process of processing the substrate in the process chamber by rotating the rotation shaft using the rotary mechanism, ejecting some of gas supplied to the rotary mechanism into the process chamber through the first gas ejection port by a first amount for a predetermined time period, and ejecting at least the rest of the gas supplied to the rotary mechanism into the process chamber through the second gas ejection port by a second amount equal to or greater than the first amount for the predetermined time period.

According to another aspect of the present invention, there is provided a method of manufacturing a semiconductor device, the method comprising: a process of placing a substrate holder in which a substrate is held on a substrate holder stage of which at least a part is made of a metal, loading the substrate holder into a process chamber, and closing the process chamber by using a cover part; and a process of processing the substrate in the process chamber by: rotating a rotation shaft, which is inserted through the cover part and connected to the substrate holder stage so that a first gas ejection port is formed between the rotation shaft and the cover part, by using a rotary mechanism installed at a side of the cover part opposite to the process chamber; ejecting some of gas supplied to the rotary mechanism into the process chamber through the first gas ejection port by a first amount for a predetermined time period; and ejecting at least the rest of the gas supplied to the rotary mechanism into the process chamber through a second gas ejection port formed at the substrate holder stage by a second amount equal to or greater than the first amount for the predetermined time period.

DETAILED DESCRIPTION OF THE PREFERRED EMBODIMENTS

Embodiments of the present invention will be described hereinafter with reference to the attached drawings.

First Embodiment (1) Structure of Substrate Processing Apparatus

First, with reference to FIG. 1, an explanation will be given on an exemplary process furnace that can be properly used according to a first embodiment of the present invention.

Figure 1:
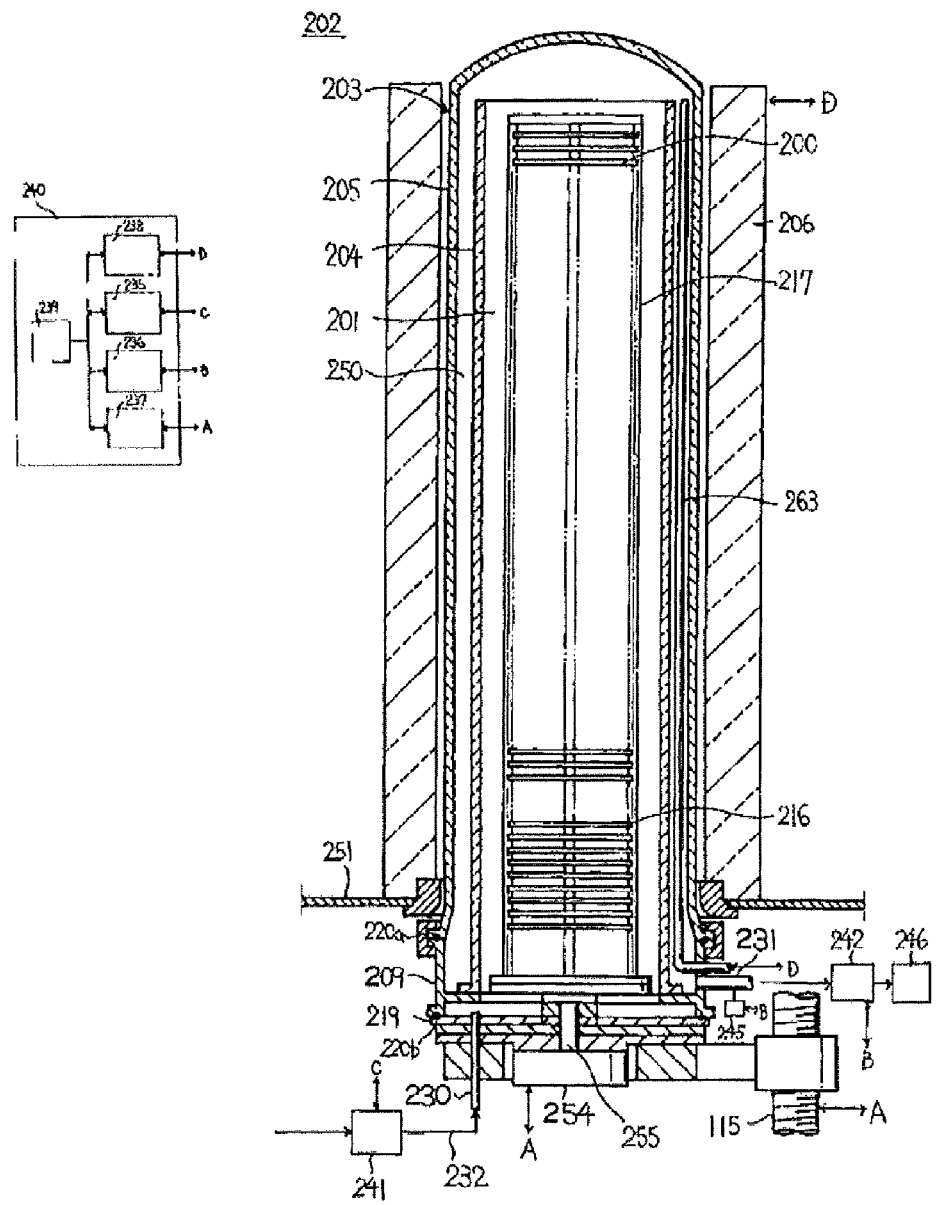
FIG. 1 is a sectional view illustrating a process furnace of a substrate processing apparatus according to a first embodiment of the present invention.

FIG. 1 is a vertical sectional view schematically illustrating a process furnace 202 of a substrate processing apparatus according to the first embodiment of the present invention.

As shown in FIG. 1, the process furnace 202 includes a heater 206 as a heating mechanism. The heater 206 has a cylindrical shape and is supported by a holding plate such as a heater base 251 so that the heater 206 can be vertically installed.

Inside the heater 206, a process tube 203 used as a reaction tube is disposed coaxially with the heater 206. The process tube 203 includes an inner tube 204 used as an inner reaction tube, and an outer tube 205 installed outside the inner tube 204 as an outer reaction tube. The inner tube 204 is made of a heat-resistant material such as quartz ($SiO_2$) or silicon carbide (SiC), and has a cylindrical shape with opened top and bottom sides. At the cylindrical hollow part of the inner tube 204, a process chamber 201 is formed. The process chamber 201 is configured to accommodate substrates such as wafers 200 in a state where the wafers 200 are horizontally oriented and vertically arranged in multiple stages by using a boat 217 (described later). The outer tube 205 is made of a heat-resistant material such as quartz and silicon carbide, and the inner diameter of the outer tube 205 is greater than the outer diameter of the inner tube 204. The outer tube 205 has a cylindrical shape with a closed top side and an opened bottom side. The outer tube 205 is installed coaxially with the inner tube 204.

Under the outer tube 205, a manifold 209 is disposed coaxially with the outer tube 205. The manifold 209 is made of a material such as stainless steel and has a cylindrical shape with opened top and bottom sides. The manifold 209 is installed in a manner such that the manifold 209 is engaged with the respective inner and outer tubes 204 and 205 for supporting the inner and outer tubes 204 and 205. Between the manifold 209 and the outer tube 205, an O-ring 220a is installed as a seal member. The manifold 209 is supported by the heater base 251 so that the process tube 203 can be vertically installed. The process tube 203 and the manifold 209 form a reaction vessel.

A nozzle 230 is connected to a seal cap 219 (described later) in a manner such that the nozzle 230 can communicate with the inside of the process chamber 201. A gas supply pipe 232 is connected to the nozzle 230. A process gas or inert gas supply source (not shown) is connected to an upstream side of the gas supply pipe 232 opposite to the nozzle 230, and a gas flowrate controller such as a mass flow controller (MFC) 241 is disposed between the process gas or inert gas supply source and the upstream side of the gas supply pipe 232. A gas regulating unit such as a gas flowrate control unit 235 is electrically connected to the MFC 241. The gas flowrate control unit 235 is configured to perform a controlling operation so that a desired amount of gas can be supplied to the inside of the process chamber 201 at a desired time.

At the manifold 209, an exhaust pipe 231 is installed so as to exhaust the inside atmosphere of the process chamber 201. The exhaust pipe 231 is disposed at a lower region of a cylindrical space 250 formed between the inner tube 204 and the outer tube 205, and the exhaust pipe 231 communicates with the cylindrical space 250. A vacuum exhaust device 246 such as a vacuum pump is connected to a downstream side of the exhaust pipe 231 opposite to the manifold 209, and a pressure detector such as a pressure sensor 245 and a pressure regulating device 242 are disposed between the vacuum exhaust device 246 and the downstream side of the exhaust pipe 231. The vacuum exhaust device 246 is configured to evacuate the inside of the process chamber 201 to a predetermined pressure (vacuum degree). A pressure control unit 236 is electrically connected to the pressure regulating device 242 and the pressure sensor 245. Based on pressure information detected by the pressure sensor 245, the pressure control unit 236 controls the pressure regulating device 242 so that the inside of the process chamber 201 can be kept at a desired pressure at a desired time.

At the lower side of the manifold 209, the seal cap 219 is installed as a cover part capable of air-tightly closing the opened bottom side of the manifold 209. The seal cap 219 is configured to be brought into contact with the bottom side of the manifold 209 in a down-to-up direction perpendicular to the bottom side of the manifold 209. The seal cap 219 is made of a metal such as stainless steel and has a cylindrical shape. On the top surface of the seal cap 219, an O-ring 220b is installed as a seal member that makes contact with the bottom side of the manifold 209. At a side of the seal cap 219 opposite to the process chamber 201, a rotary mechanism 254 is installed so as to rotate the boat 217. A rotation shaft 255 of the rotary mechanism 254 is connected to the boat 217 (described later) through the seal cap 219. The rotary mechanism 254 is configured to rotate wafers 200 by rotating the boat 217. The seal cap 219 is configured to be vertically moved by a boat elevator that is vertically installed outside the process tube 203 as a lift mechanism. Owing to this, the boat 217 can be loaded into and unloaded from the process chamber 201. A driving control unit 237 is electrically connected to the rotary mechanism 254 and the boat elevator 115. Under the control of the driving control unit 237, the rotary mechanism 254 and the boat elevator 115 can be operated in a desired manner at a desired time.

The boat 217 used as a substrate holder is made of a heat-resistant material such as quartz or silicon carbide, and the boat 217 is configured to hold a plurality of rotate wafers 200 in a state where the wafers 200 are horizontally oriented and arranged in multiple stages with their centers being aligned. At the lower part of the boat 217, as insulation members, a plurality of disk-shaped insulation plates 216 made of a heat-resistant material such as quartz or silicon carbide are horizontally disposed in multiple stages, and thus, heat transfer from the heater 206 to the manifold 209 is difficult.

At the process tube 203, a temperature sensor 263 is installed as a temperature detector. A temperature control unit 238 is electrically connected to the heater 206 and the temperature sensor 263. Based on temperature information detected by the temperature sensor 263, the temperature control unit 238 controls power supplied to the heater 206 so that desired temperature distribution can be obtained inside the process chamber 201 at a desired time.

The gas flowrate control unit 235, the pressure control unit 236, the driving control unit 237, and the temperature control unit 238 are electrically connected to a main control unit 239 used to control the overall operation of the substrate processing apparatus. In addition, the main control unit 239 constitutes a manipulation unit and an input/output unit. A controller 240 is constituted by the gas flowrate control unit 235, the pressure control unit 236, the driving control unit 237, the temperature control unit 238, and the main control unit 239.

(2) Substrate Processing Process

Next, as a process of manufacturing a semiconductor device by using the process furnace 202, a method of forming a thin film on a wafer 200 using a chemical vapor deposition (CVD) method will now be described. In the following description, components of the substrate processing apparatus are controlled by the controller 240.

If a plurality of wafers 200 are charged into the boat 217, as shown in FIG. 1, the boat 217 in which the plurality of wafers 200 are held is moved upward by the boat elevator 115 and loaded into the process chamber 201 (boat loading). In this state, the bottom side of the manifold 209 is sealed by the seal cap 219 with the O-ring 220b being disposed therebetween.

The inside of the process chamber 201 is evacuated by the vacuum exhaust device 246 to a desired pressure (vacuum degree). At this time, the inside pressure of the process chamber 201 is measured by the pressure sensor 245, and based on the measured pressure, the pressure regulating device 242 is feedback-controlled. In addition, the inside of the process chamber 201 is heated by the heater 206 to obtain desired temperature distribution. At this time, to obtain desired temperature distribution inside the process chamber 201, power supplied to the heater 206 is feedback-controlled based on temperature information detected by the temperature sensor 263. Next, the boat 217 is rotated by the rotary mechanism 254 to rotate the wafers 200.

Next, gas supplied from the process gas supply source and of which the flowrate is controlled by the MFC 241 is allowed to flow through the gas supply pipe 232, and then the gas is introduced into the process chamber 201 through the nozzle 230. The gas introduced into the process chamber 201 flows upward and enters the cylindrical space 250 through the opened top side of the inner tube 204, and then the gas is discharged through the exhaust pipe 231. When the gas flows through the inside of the process chamber 201, the gas makes contact with surfaces of the wafers 200. At this time, thin-films are deposited on the surfaces of the wafers 200 by thermal CVD reaction.

After a predetermined time, inert gas is supplied from the inert gas supply source. At the same time the inside atmosphere of the process chamber 201 is replaced with inert gas, the inside pressure of the process chamber 201 returns to atmospheric pressure.

Thereafter, the seal cap 219 is moved downward by the boat elevator 115, and the bottom side of the manifold 209 is opened. Then, the boat 217 in which the processed wafers 200 are held is unloaded from the process chamber 201 through the bottom side of the manifold 209 (boat unloading). After that, the processed wafers 200 are discharged from the boat 217 (wafer discharging).

The following process conditions are exemplary conditions for processing wafers 200 in the process furnace 202 of the current embodiment. For example, if a $Si_3N_4$ film formed, the process temperature may be set in the range from 750° C. to 800° C., the process pressure may be set in the range from 10 Pa to 200 Pa, and dichlorosilane (DCS) gas and ammonia ($NH_3$) gas may be supplied to the inside of the process chamber 201. While wafers 200 are processed, each process condition may be constantly kept at a certain value in the above-mentioned range.

In addition, as a process of cleaning the inside of the process chamber 201 before a process of processing wafers 200, a pre-cleaning process may be performed by supplying HCl gas or dichlorosilane gas to the inside of the process chamber 201.

(3) Peripheral Structure of Boat Stage

Figure 2:
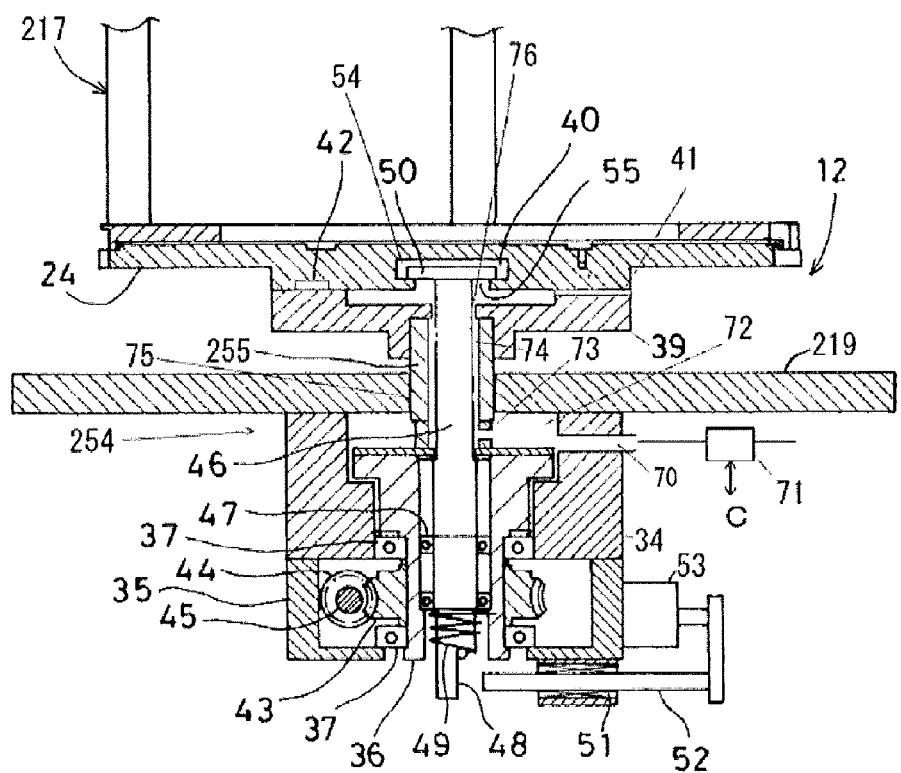
FIG. 2 is an enlarged sectional view illustrating the peripheral structure of a rotary mechanism of the process furnace of the substrate processing apparatus according to the first embodiment of the present invention.

Next, the peripheral structure of a boat stage 12 will be described with reference to FIG. 2.

Under the seal cap 219, the rotary mechanism 254 mainly made of a metal and including a boat locking mechanism is installed.

The rotary mechanism 254 includes a metallic motor holder 34 installed on the bottom surface of the seal cap 219. On the bottom surface of the motor holder 34, a decelerator 35 mainly made of a metal is installed. A hollow outer rotation shaft 36 is rotatably installed through the decelerator 35 and the motor holder 34 with bearings 37 being disposed therebetween.

At the upper end of the outer rotation shaft 36, a rotation shaft 255 is installed in a manner such that the rotation shaft 255 penetrates the seal cap 219. At the upper end of the rotation shaft 255, a metallic boat stage board 39, at least a part of which is made of a metal, is installed as a substrate holder stage. On the top surface of the boat stage board 39, grooves 41 are formed in three radial directions, and positioning pins 42 are disposed. By disposing the positioning pins 42 in holes formed at positions that trisect the bottom surface of a boat bottom plate 24 in a circumferential direction, the position of the boat 217 can be determined relative to the boat stage board 39. In addition, at the bottom surface of the boat bottom plate 24, a locking hole 40 (described later) is formed.

Between the bearings 37 of the outer rotation shaft 36, a worm wheel 43 is installed. A worm (worm gear) 44 is engaged with the worm wheel 43. The worm 44 is installed at an output shaft 45 of a boat rotating motor (not shown). A rotation detector (not shown) is installed at the worm 44 so as to detect the rotational position of the outer rotation shaft 36. By using the rotation detector, the rotational position of the outer rotation shaft 36 relative to the seal cap 219 can be detected. In addition, the rotation detector is configured to detect a reference position of the outer rotation shaft 36, that is, the boat stage board 39.

A hollow is formed in the metallic rotation shaft 255. A metallic boat locking shaft 46, which is coaxial with the outer rotation shaft 36 and the rotation shaft 255, is installed in the hollows of the outer rotation shaft 36 and the rotation shaft 255. The boat locking shaft 46 is rotatable relative to the outer rotation shaft 36 owing to a bearing 47 disposed therebetween. The boat locking shaft 46 protrudes more than the boat stage board 39. An angled metallic locking plate 50 is fixed to the protruded end of the boat locking shaft 46 as a locking member. The lower end part of the boat locking shaft 46 is partially cut in a semicircular shape, and thus a flat surface 48 is formed at the lower end part of the boat locking shaft 46. The flat surface 48 protrudes downward more than the lower end of the decelerator 35.

A locking spring 49 such as a torsion coil spring is wound around the lower end part of the boat locking shaft 46. One end of the locking spring 49 is bent and engaged with the flat surface 48, and the other end of the locking spring 49 is tangentially extended and engaged with the outer rotation shaft 36. Particularly, between the boat locking shaft 46 and the outer rotation shaft 36, a mechanical stopper (not shown) is installed. The locking spring 49 is initially twisted so that the locking spring 49 can be surely brought into contact with the boat locking shaft 46 and the outer rotation shaft 36.

At the bottom surface of the decelerator 35, a locking rod 52 is slidably installed in a direction perpendicular to the center axis of the outer rotation shaft 36 with a slide bearing 51 being disposed therebetween. A leading end of the locking rod 52 can make contact with the flat surface 48. A base end of the locking rod 52 is connected to a locking actuator 53 (linear driving unit) such as a cylinder and a solenoid.

Therefore, by reciprocating the locking rod 52 using the locking actuator 53, the leading end of the locking rod 52 can be brought into contact with the flat surface 48 and moved away from the flat surface 48. When the locking rod 52 is brought into contact with the flat surface 48, the rotation of the boat locking shaft 46 cannot be rotated.

A boat locking mechanism is constituted mainly by the locking plate 50, the boat locking shaft 46, the locking spring 49, the locking rod 52, and the locking actuator 53.

As a method of locking the rotation of the boat locking shaft 46, the above-described method is not unique. For example, a horizontally extending pin may be installed at the lower end of the boat locking shaft 46, and an engagement member may be reciprocated with respect to a rotation surface of the pin.

In the boat bottom plate 24, the locking hole 40 is formed, and the locking plate 50 can be engaged with and disengaged from the locking hole 40.

The locking hole 40 includes a disk-shaped bag hole 54 formed in the boat bottom plate 24. The bag hole 54 is opened through a key hole 55. The key hole 55 has an approximate rectangular contour formed by two arcs having the same radius as the bag hole 54 and mutually facing parallel lines. The key hole 55 has a shape similar to that of the locking plate 50.

Therefore, the locking plate 50 can be engaged with the key hole 55 by inserting the locking plate 50 in the bag hole 54 through the key hole 55 so that the boat locking shaft 46 can be rotated relative to the boat bottom plate 24. The boat stage board 39 and the boat bottom plate 24 are locked so as to prevent separation, that is, to prevent falling of the boat 217.

As described above, by fitting the positioning pins 42 to the holes, the rotational position of the boat 217 is determined with respect to the boat stage board 39. In addition, when locking rod 52 does not makes contact with the flat surface 48, the rotational positions of the boat locking shaft 46 and the boat stage board 39 are determined by the initial spring force of the locking spring 49 and the stopper between the boat locking shaft 46 and the outer rotation shaft 36.

Therefore, the direction of the key hole 55 formed in the boat bottom plate 24 of the boat 217 placed on the boat stage board 39 is 90° from the direction of the locking plate 50 when the locking rod 52 is not engaged with the boat locking shaft 46.

At the motor holder 34, a gas supply part 70 is installed to supply gas to a first gas stagnant part 72. A gas supply line disposed at an upstream side of the gas supply part 70 opposite to the first gas stagnant part 72 is connected to an inert gas supply source (not shown) with a gas flowrate controller such as mass flow controller (MFC) 71 being disposed therebetween. The gas flowrate control unit 235 is electrically connected to the MFC 71. The gas flowrate control unit 235 is configured to perform a controlling operation so as to adjust the flowrate of gas supplied through the gas supply part 70 to a desired value at a desired time.

Between the seal cap 219 and the rotation shaft 255, a first gap 75 is formed as a first gas ejection port. That is, the rotation shaft 255 is inserted through the seal cap 219 and connected to the boat stage board 39 and the rotary mechanism 254 (the outer rotation shaft 36) in a manner such that the first gap 75 can be formed between the seal cap 219 and the rotation shaft 255. The outer diameter of the first gap 75 (that is, the diameter of a penetration hole formed in the seal cap 219) is smaller than the inner diameter of the motor holder 34.

The first gas stagnant part 72 is surrounded by at least the rotary mechanism 254, the seal cap 219, and the rotation shaft 255. That is, the first gas stagnant part 72 is configured by a space surrounded by at least the motor holder 34, the outer rotation shaft 36, the seal cap 219, and the rotation shaft 255. The first gas stagnant part 72 is configured by a space which is wholly closed except for positions of the gas supply part 70, the first gap 75, and flow ports 73 (described later). In addition, the first gas stagnant part 72 communicates with the process chamber 201 through a gas flow passage narrowed at the first gap 75.

At the boat stage board 39, a second gap 76 is formed as a second gas ejection port. The second gap 76 is configured by a space surrounded by at least the boat stage board 39 and the boat locking shaft 46. The outer diameter of the second gap 76 (that is, the diameter of a penetration hole formed in the boat stage board 39) is smaller than the inner diameter of the rotation shaft 255.

At the rotation shaft 255, a second gas stagnant part 74 is installed. The second gas stagnant part 74 is formed by a space surrounded by at least the outer rotation shaft 36, the rotation shaft 255, the boat stage board 39, and the boat locking shaft 46. The second gas stagnant part 74 is formed by a space which is wholly closed except for positions of the flow ports 73 and the second gap 76. In addition, the second gas stagnant part 74 communicates with the process chamber 201 through a gas flow passage narrowed at the second gap 76.

At the sidewall of the rotation shaft 255, the flow ports 73 are formed. Through the flow ports 73, the first gas stagnant part 72 and the second gas stagnant part 74 can communicate with each other. The flow ports 73 are formed at positions that trisect the side part of the rotation shaft 255 in a circumferential direction. Therefore, although the rotation shaft 255 is rotated, gas can easily flow from the inside of the first gas stagnant part 72 to the inside of the second gas stagnant part 74 through the flow ports 73.

The volume of the first gas stagnant part 72 is greater than the volume of the second gas stagnant part 74. The first gap 75 has the same volume as the second gap 76.

(4) Effects of Current Embodiment

In the above-described structure, if process gas used for processing substrates or highly corrosive gas used for cleaning the inside of the process chamber 201 such as etching gas or cleaning gas is allowed to enter the rotary mechanism 254 through the first gap 75 or the inside of the rotation shaft 255 through the second gap 76, the insides of the rotary mechanism 254 and the rotation shaft 255 may corrode, or byproducts generated by, for example, reaction of process gas may attach to the insides of the rotary mechanism 254 and the rotation shaft 255 to hinder the operation of the rotary mechanism 254.

For these reasons, in the current embodiment, the first gas stagnant part 72 is formed at the upstream side of the first gap 75 configured to eject purge gas, and the second gas stagnant part 74 is formed at the upstream side of the second gap 76 configured to eject purge gas.

Purge gas supplied to the inside of the first gas stagnant part 72 is allowed to stay temporarily, and thus the inside pressure of the first gas stagnant part 72 is increased. Therefore, there may be no pressure difference along the whole periphery of the first gap 75 used as a first ejection port, and thus the flow velocity along the whole periphery of the first gap 75 can be uniformly maintained. In addition, the flow velocity of purge gas ejected through the first gap 75 can be increased.

Similarly, purge gas supplied to the inside of the second gas stagnant part 74 is allowed to stay temporarily, and thus the inside pressure of the second gas stagnant part 74 is increased. Therefore, there may be no pressure difference along the whole periphery of the second gap 76 used as a second ejection port, and thus the flow velocity along the whole periphery of the second gap 76 can be uniformly maintained. In addition, the flow velocity of purge gas ejected through the second gap 76 can be increased.

Owing to this, highly corrosive process gas can be prevented from entering the rotary mechanism 254 through the first gap 75 or the inside of the rotation shaft 255 through the second gap 76. Therefore, the insides of the rotary mechanism 254 and the rotation shaft 255, and the boat locking shaft 46 can be protected from corrosion, and byproducts generated by, for example, reaction of process gas can be prevented from attaching to the insides of the rotary mechanism 254 and the rotation shaft 255, and the boat locking shaft 46, thereby ensuring the operation of the rotary mechanism 254. That is, since metal surfaces can be protected by purge gas, metal corrosion can be suppressed, and scattering of metal particles can be suppressed. In addition, generation of particles caused by byproducts attached to the insides of the rotary mechanism 254 and the rotation shaft 255, and the boat locking shaft 46 can be prevented during the operation of the rotary mechanism 254, the rotation shaft 255, or the boat locking shaft 46. Therefore, contamination of substrates can be prevented, and thus the process quality and yield can be improved.

In addition, according to the current embodiment, the volume of the first gas stagnant part 72 is greater than the volume of the second gas stagnant part 74. Therefore, purge gas can easily flow from the first gas stagnant part 72 to the flow ports 73.

In addition, preferably, the flow-channel sectional areas of the first gap 75 and the second gap 76 are as small as possible so long as the rotations of the rotation shaft 255 and the boat locking shaft 46 are not hindered. By this configuration, the flow velocity of purge gas ejected into the process chamber 201 through the first gap 75 and the second gap 76 can be increased.

According to the current embodiment, at least in the state where the boat 217 is loaded into the process chamber 201 and substrates are processed, purge gas is supplied through the gas supply part 70. However, the present invention is not limited thereto. For example, purge gas can be supplied through the gas supply part 70 all the times. Alternatively, only in the case where parts of metallic components such as the boat stage board 39 and the rotation shaft 255 are exposed to the inside of the process chamber 201 where corrosive gas is supplied or remains, purge gas may be supplied through the gas supply part 70 for saving unnecessary purge gas supply costs.

Purge gas is introduced into the first gas stagnant part 72 through the gas supply part 70. Thereafter, some of the purge gas is introduced into the process chamber 201 through the first gap 75. The rest of the purge gas is introduced into the second gas stagnant part 74 through the flow ports 73. The purge gas introduced into the second gas stagnant part 74 flows to the periphery of the locking hole 40 and is discharged into the process chamber 201 through the grooves 41.

That is, purge gas is introduced into the first gas stagnant part 72; some of the purge gas introduced into the first gas stagnant part 72 is introduced into the process chamber 201 through the first gap 75; the rest of the purge gas introduced into the first gas stagnant part 72 is introduced into the second gas stagnant part 74 through the flow ports 73; and the purge gas introduced into the second gas stagnant part 74 flows to the periphery of the locking hole 40 and is discharged into the process chamber 201 through the grooves 41. Therefore, metallic surfaces such as the surfaces of the rotation shaft 255, the boat locking shaft 46, and the boat stage board 39 can be covered with purge gas. Owing to this, such surfaces can be prevented from making contact with process gas, and thus although the process gas is corrosive gas, corrosion of the surfaces of the rotation shaft 255, the boat locking shaft 46, and the boat stage board 39 can be prevented. In addition, attachment of byproducts to the inner surface of the rotation shaft 255, the surface of the boat locking shaft 46, and the inside of the rotary mechanism 254 can be suppressed, and thus the operation of the rotary mechanism 254 can be ensured.

Purge gas is introduced from the second gas stagnant part 74 to the periphery of the locking hole 40 through the second gap 76, and then the purge gas is discharged into the process chamber 201 through the grooves 41 which are gas passages much smaller than the locking hole 40. Therefore, the periphery of the locking hole 40 can also be filled with stagnant purge gas. Owing to this, the periphery of the locking hole 40 and the surface of the locking plate 50 can be prevented from making contact with process gas, and thus although the process gas is corrosive gas, corrosion of the periphery of the locking hole 40 and the surface of the locking plate 50 can be prevented. In addition, attachment of byproducts to the periphery of the locking hole 40 and the surface of the locking plate 50 can be suppressed.

Modified Version of First Embodiment

A first modified version will now be explained.

In order to prevent corrosion of the rotation shaft 255 and the rotary mechanism 254 and ensure their rotation operations, as described above, it is necessary to maintain the flow velocity of purge gas ejected through the first gap 75 and the flow velocity of purge gas ejected through the second gap 76 at predetermined levels. If the flow velocity of purge gas ejected through the second gap 76 is too low, that is, if the flow velocity of purge gas ejected through the second gap 76 is much smaller than the flow velocity of purge gas ejected through the first gap 75, a small amount of process gas can enter the inside of the rotation shaft 255 through the second gap 76 according to the inside pressure of the process chamber 201.

In this case, by increasing the flowrate of purge gas supplied through the gas supply part 70, the flow velocity of purge gas ejected through the second gap 76 can be increased. However, in the case where the flow velocity of purge gas ejected through the second gap 76 is increased, the consumption of purge gas may also be unnecessarily increased. Moreover, due to the increased amount of purge gas supplied to the inside of the process chamber 201, the distribution of gas inside the process chamber 201 may be varied, that is, the density of process gas inside the process chamber 201 may be decreased, and thus the processed states of wafers 200, particularly, wafers 200 placed in the lower part of the boat 217 may be varied.

For these reasons, in the current modified version, it is preferably configured that the flow velocity of purge gas ejected through the first gap 75 is equal to the flow velocity of purge gas ejected through the second gap 76. In detail, as expressed by Formula 1 below, the ratio of the volume of the second gas stagnant part 74 to the volume of the second gap 76 is set to be equal to the ratio of the volume of the first gas stagnant part 72 to the sum of the volumes of the first gap 75 and the flow ports 73.

(volume of second gas stagnant part 74)/(volume of second gap 76)=(volume of first gas stagnant part 72)/(volume of first gap 75+volume of flow ports 73)   (Formula 1)

Figure 3:
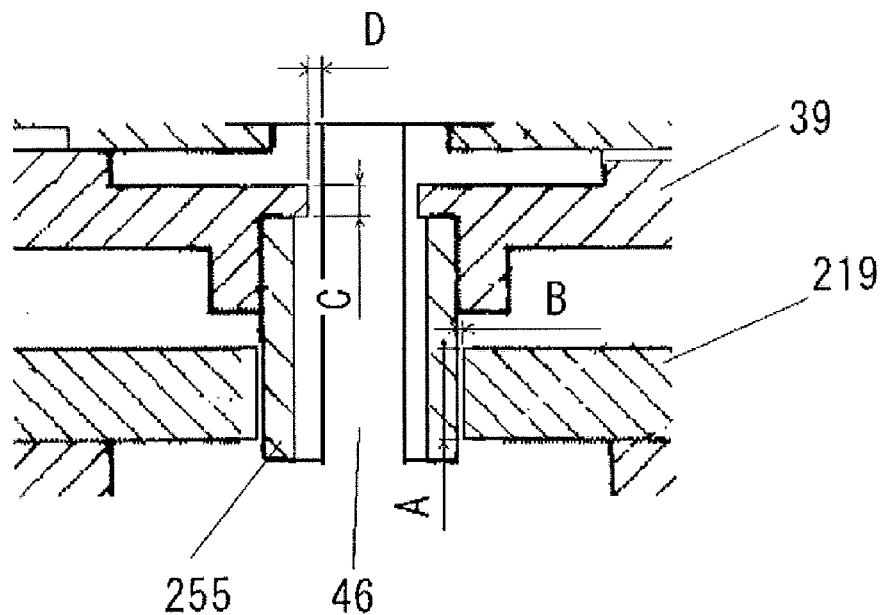
FIG. 3 is an enlarged sectional view illustrating the peripheral structure of a first gap and a second gap of the process furnace of the substrate processing apparatus according to the first embodiment of the present invention.

The volume of the first gap 75 is calculated as shown in FIG. 3 by multiplying the flow-channel sectional area (B) of the first gap 75 by the flow-channel length (A) of the first gap 75. The volume of the second gap 76 is calculated as shown in FIG. 3 by multiplying the flow-channel sectional area (D) of the second gap 76 by the flow-channel length (C) of the second gap 76. The volume of the flow ports 73 is calculated in the same manner. Owing to this structure, the flow velocity of gas ejected through the first gap 75 can be equal to the flow velocity of gas ejected through the second gap 76. Therefore, independently of the inside pressure of the process chamber 201, for example, although the inside of the process chamber 201 is in a highly-evacuated state at about 20 Pa to 30 Pa or the inside pressure of the process chamber 201 is slightly decreased at a pressure close to atmospheric pressure, process gas can be prevented from entering the insides of the rotary mechanism 254 and the rotation shaft 255. Accordingly, corrosion of the rotary mechanism 254 and the rotation shaft 255 can be suppressed, and the rotation operations of the rotary mechanism 254 and the rotation shaft 255 can be guaranteed. Preferably, the volume of the first gap 75 may be smaller than the volume of the flow ports 73. In this case, a moderate amount of purge gas can be supplied to the second gas stagnant part 74.

A second modified version will now be described.

Particularly, the periphery of the second gap 76 is disposed close to the heater 206 as compared with the first gap 75 and the seal cap 219. Therefore, when the inside of the process chamber 201 is heated to process wafers 200, the periphery of the second gap 76 can be heated to a high temperature and be corroded more easily than the seal cap 219, the periphery of the first gap 75, and the rotation shaft 255.

The flow channel of the second gas stagnant part 74 is narrower and longer than the flow channel of the first gas stagnant part 72. Therefore, the exhaust resistance of the second gas stagnant part 74 may be relatively large, and the flow velocity of purge gas ejected through the second gap 76 may be relatively low. Particularly, the second gas stagnant part 74 may be easily affected by the surface roughness of the boat locking shaft 46 and the rotation shaft 255, and the exhaust resistance of the second gas stagnant part 74 may be easily increased. Moreover, the second gas stagnant part 74 is located at the downstream side of the first gas stagnant part 72, and purge gas is supplied to the inside of the second gas stagnant part 74 through the flow ports 73. Therefore, if the flow conductance of the flow ports 73 is low, it is difficult to supply purge gas to the inside of the second gas stagnant part 74. Due to these reasons, the flow velocity of purge gas ejected through the second gap 76 can be undesirably reduced.

Therefore, preferably, it may be configured so that the flow velocity of purge gas ejected through the second gap 76 is greater than the flow velocity of purge gas ejected through the first gap 75. In detail, as expressed by Formula 2 below, the ratio of the volume of the second gas stagnant part 74 to the volume of the second gap 76 is set to be greater than the ratio of the volume of the first gas stagnant part 72 to the sum of the volumes of the first gap 75 and the flow ports 73.

(volume of second gas stagnant part 74)/(volume of second gap 76)>(volume of first gas stagnant part 72)/(volume of first gap 75+volume of flow ports 73)  (Formula 2)

Therefore, although purge gas receives much exhaust resistance as being ejected through the second gap 76 than as being ejected through the first gap 75 or the flow conductance of the flow ports 73 is low, the flow velocity of purge gas ejected through the second gap 76 can be equal to or higher than the flow velocity of purge ejected through the first gap 75. As a result, a relatively large amount of purge gas can be supplied to the periphery of the second gap 76 which is easy to corrode. In this way, corrosion of the periphery of the second gap 76 and the boat stage board 39 can be further prevented.

Preferably, the ratio of the volume of the second gas stagnant part 74 to the volume of the second gap 76 may be set to be not greater than two times the ratio of the volume of the first gas stagnant part 72 to the sum of the volumes of the first gap 75 and the flow ports 73. In this case, more desirable balancing may be possible between the flow velocity of gas ejected through the first gap 75 and the flow velocity of gas ejected through the second gap 76.

In other words, a first gas flow channel can be formed by the first gas stagnant part 72 and the first gap 75, and a second gas flow channel can be formed by the flow ports 73, the second gas stagnant part 74, and the second gap 76. In the case where the second gas flow channel is longer than the first gas flow channel, this modified version may be particularly effective.

Next, simulation results will be explained.

In the structure of the first embodiment, the volume of the first gas stagnant part 72 was set to 25100 mm², the volume of the first gap 75 was set to 17 mm², the volume of the flow ports 73 was set to 340 mm², the volume of the second gas stagnant part 74 was set to 1910 mm², and the volume of the second gap 76 was set to 17 mm². That is, the ratio of the volume of the second gas stagnant part 74 to the volume of the second gap 76 was set to about 112, and the ratio of the volume of the first gas stagnant part 72 to the sum of the volumes of the first gap 75 and the flow ports 73 was set to about 70. Thus, the ratio of the volume of the second gas stagnant part 74 to the volume of the second gap 76 was about 1.6 times the ratio of the volume of the first gas stagnant part 72 to the sum of the volumes of the first gap 75 and the flow ports 73 was set to about 70. Then, the simulation was performed in a condition that ammonia (NH₃) gas was supplied through the gas supply part 70.

According to the simulation, the flow velocity of ammonia gas ejected through the second gap 76 was 1.6 times the flow velocity of ammonia gas ejected through the first gap 75. That is, it is possible to make the flow velocity of ammonia gas ejected through the second gap 76 greater than the flow velocity of ammonia gas ejected through the first gap 75.

Second Embodiment

Figure 4:
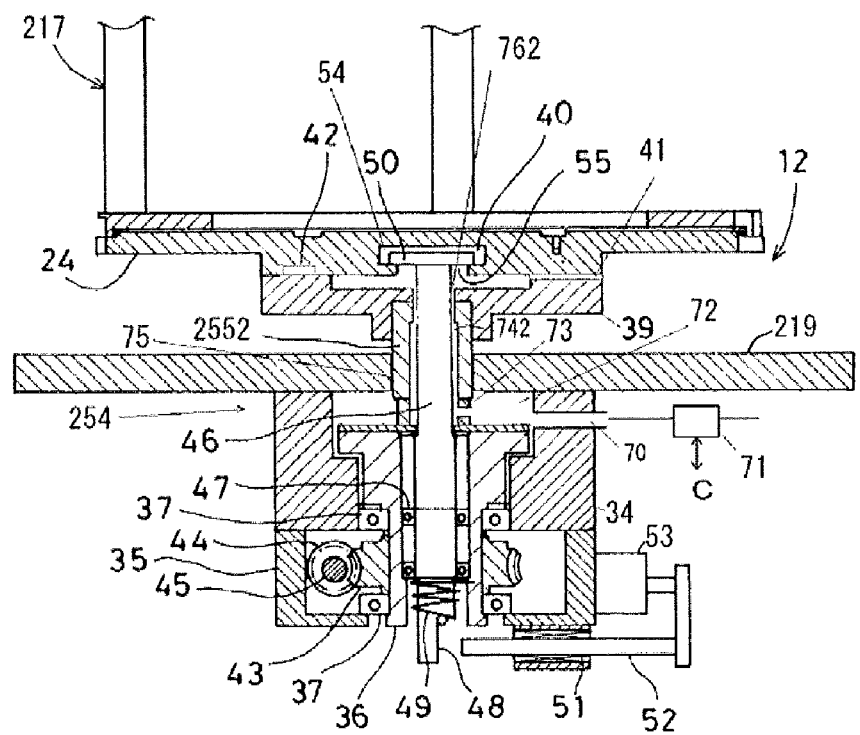
FIG. 4 is an enlarged sectional view illustrating the peripheral structure of a rotary mechanism of a process furnace of a substrate processing apparatus according to a second embodiment of the present invention.

FIG. 4 illustrates a second embodiment. The current embodiment is different from the first embodiment in that a second gap 762 is formed at a boat stage board 39 and the upper part of a rotation shaft 2552.

In the current embodiment, the inner diameter of the rotation shaft 2552 from an intermediate position to the top end of the inner wall of the rotation shaft 2552 is equal to the inner diameter of the boat stage board 39. That is, the inner diameter from the intermediate position of the inner wall of the rotation shaft 2552 to the top end of the inner wall of the boat stage board 39 is uniform. In other words, the second gap 762 is formed at the boat stage board 39 and the upper part of the second gap 762.

In the above-described structure, the volume of a second gas stagnant part 742 may be relatively small as compared with that in the first embodiment. However, the current embodiment provides the same effects as the first embodiment. In addition, the first and second modified versions of the first embodiment can be applied to the current embodiment.

Third Embodiment

Figure 5:
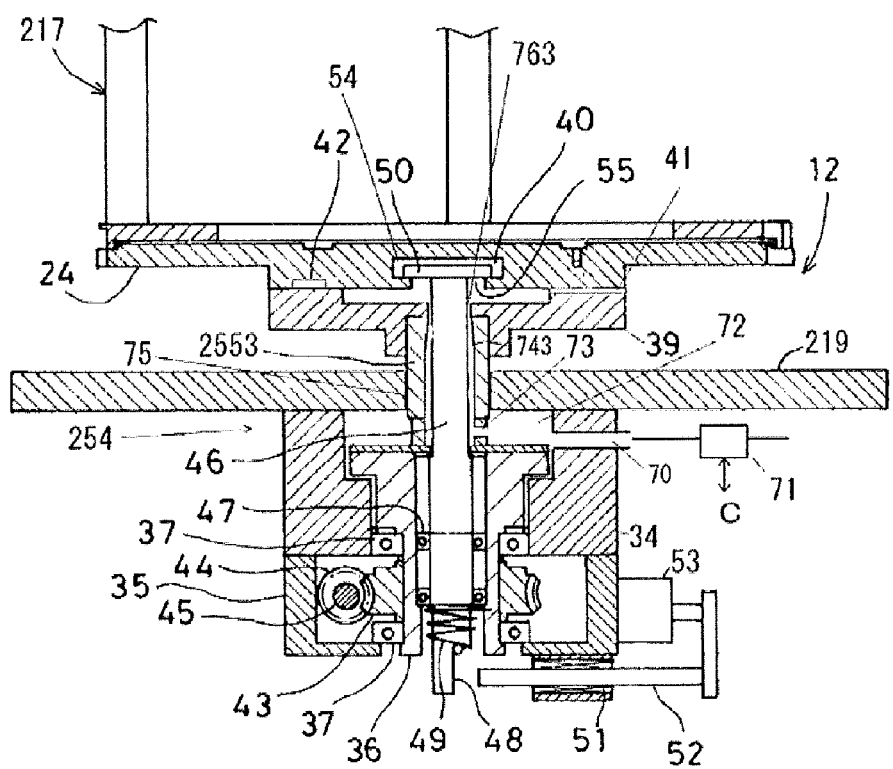
FIG. 5 is an enlarged sectional view illustrating the peripheral structure of a rotary mechanism of a process furnace of a substrate processing apparatus according to a third embodiment of the present invention.

FIG. 5 illustrates a third embodiment. The current embodiment is different from the first embodiment in that the outer diameter of a second gas stagnant part 743 is gradually decreased.

In the current embodiment, the inner diameter of a rotation shaft 2553 is gradually (continuously or decrementally) decreased from an intermediate position to the top end of the inner wall of the rotation shaft 2552. The inner diameter of the top end of the rotation shaft 2553 is equal to the inner diameter of the bottom end of a boat stage board 39. That is, the inner diameter of the rotation shaft 2553 is gradually decreased from the intermediate position to the top end of the inner wall of the rotation shaft 2552. In other words, the outer diameter of the second gas stagnant part 743 is gradually decreased from an intermediate position to the top end of the second gas stagnant part 743.

In the above-described structure, the volume of the second gas stagnant part 743 may be relatively small as compared with that in the first embodiment. However, the current embodiment provides the same effects as the first embodiment. In addition, the current embodiment can be modified like the first and second modified versions of the first embodiment. By gradually decreasing the inner diameter of the rotation shaft 2553 from the intermediate position to the top end of the inner wall of the rotation shaft 2552, the exhaust resistances of a boat locking shaft 46 and the rotation shaft 2553 can be reduced, and thus the flow velocity of gas ejected through a device gap 763 can be increased. The first and second modified versions of the first embodiment can be applied to the current embodiment.

Fourth Embodiment

Figure 6:
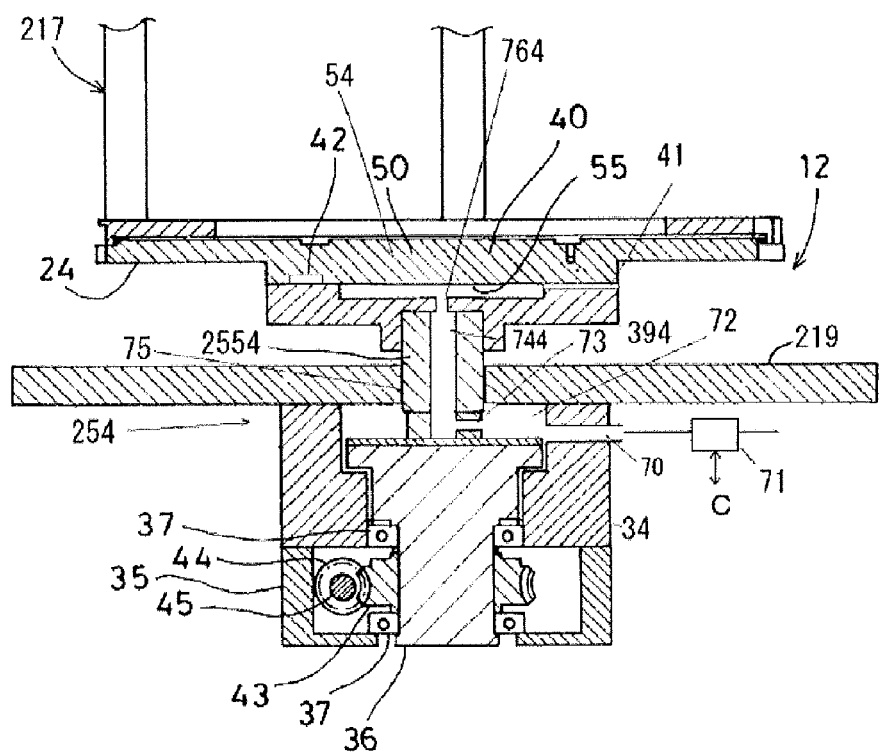
FIG. 6 is an enlarged sectional view illustrating the peripheral structure of a rotary mechanism of a process furnace of a substrate processing apparatus according to a fourth embodiment of the present invention.

FIG. 6 illustrates a fourth embodiment. The current embodiment is different from the first embodiment in that a boat locking mechanism is not used.

A second gap 764 functioning as a second gas ejection port is constituted by a penetration hole formed in a boat stage board 394. The outer diameter of the second gap 764, that is, the diameter of the penetration hole formed in the boat stage board 394 is smaller than the inner diameter of a rotation shaft 2554.

In addition, a second gas stagnant part 744 is constituted by a space surrounded by an outer rotation shaft 36, the rotation shaft 2554, and the boat stage board 394.

The volume of a first gas stagnant part 72 is greater than the volume of the second gas stagnant part 744. In addition, it is configured such that the volume of a first gap 75 is equal to the volume of the second gap 764.

Owing to the above-described structure, corrosion of the rotation shaft 2554 and the boat stage board 394 can be suppressed, and the rotation operation of a rotary mechanism 254 can be ensured. In addition, since a boat locking mechanism is not installed, corrosion of a boat locking mechanism does not occur.

In addition, the first and second modified versions of the first embodiment can be applied to the current embodiment, or the second and third embodiments can be applied to the current embodiment.

Modified Versions of First to Fourth Embodiments

In the above-described first to fourth embodiments, the outer rotation shaft 36 is installed separately from the rotation shaft (255, 2552, 2553, 2554). However, the embodiments are not limited thereto. That is, instead of installing the outer rotation shaft 36 separately, the outer rotation shaft 36 and the rotation shaft (255, 2552, 2553, 2554) may be formed in one piece, or the outer rotation shaft 36 may be formed in a manner such that the outer rotation shaft 36 can be included in the rotation shaft (255, 2552, 2553, 2554) in a broad sense.

Furthermore, in the first to fourth embodiments, the boat bottom plate 24 is described as the bottom surface of the boat 217. However, the boat bottom plate 24 may be not the bottom surface of the boat 217. For example, if an insulating cylinder is installed between the boat 217 and the boat stage board 39, the bottom surface of the insulating cylinder may be considered as the bottom surface of the boat 217 in a broad sense.

As a purge gas flowing through the gas supply part 70, inert gas such as nitrogen ($N_2$) gas and argon (Ar) gas may be used. Alternatively, one of process gases supplied to the inside of the process chamber 201 for processing wafers may be used as a purge gas if the process gas alone is not converted into solid or liquid on a surface such as the wall surface of the rotation shaft. For example, in the case where ammonia gas is supplied to the inside of the process chamber 201 for forming SiN films on wafers 200, the ammonia gas can be used as a purge gas.

Fifth Embodiment

Figure 7:
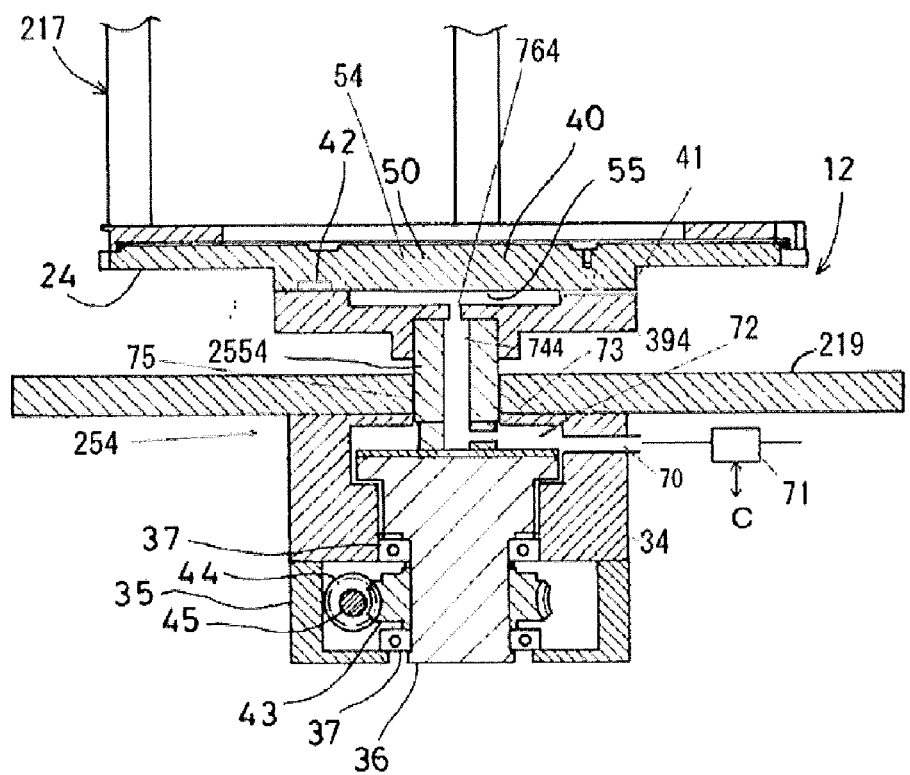
FIG. 7 is an enlarged sectional view illustrating the peripheral structure of a rotary mechanism of a process furnace of a substrate processing apparatus according to a fifth embodiment of the present invention.

FIG. 7 illustrates a fifth embodiment. The current embodiment is different from the first embodiment in that a first gas stagnant part 72 is surrounded by at least a rotation shaft 2554 and a rotary mechanism 254.

In the first embodiment, the first gas stagnant part 72 is constituted by a space surrounded by at least the motor holder 34, the outer rotation shaft 36, the seal cap 219, and the rotation shaft 255. On the other hand, in the current embodiment, the first gas stagnant part 72 is constituted by a space surrounded by at least a motor holder 34, an outer rotation shaft 36, and the rotation shaft 2554. That is, the sidewall and the ceiling wall of the first gas stagnant part 72 are formed in one piece in the motor holder 34.

In the current embodiment, the same effects as the first embodiment can be obtained. In addition, the first and second modified versions of the first embodiment can be applied to the current embodiment. Furthermore, in the current embodiment, the sidewall and the ceiling wall of the first gas stagnant part 72 are formed in one piece such that gas supplied from the gas supply part 70 to the first gas stagnant part 72 can be prevented from permeating between the motor holder 34 and a seal cap 219. Therefore, the flow velocity of purge gas ejected into the process chamber 201 through the first gas stagnant part 72 and a second gas stagnant part 74 may not be decreased.

Sixth Embodiment

Figure 8A:
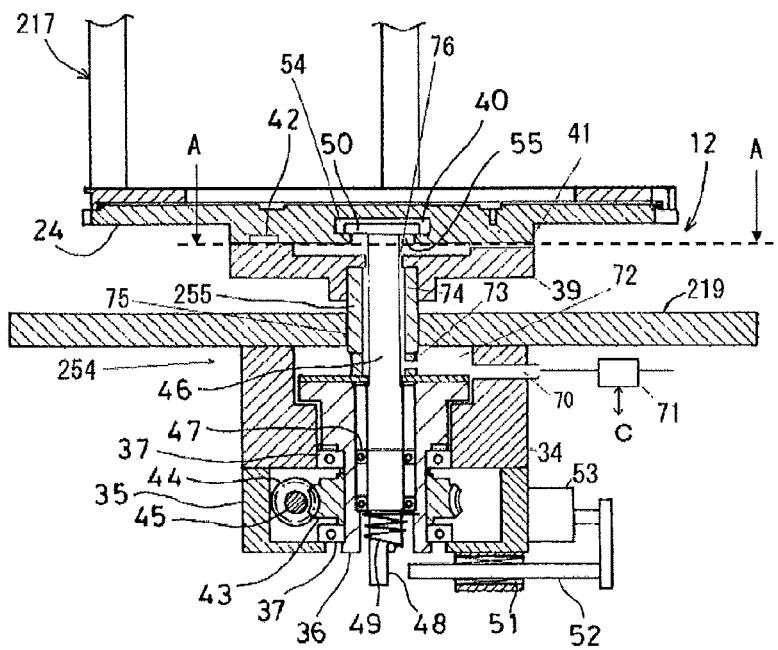
FIG. 8A is an enlarged sectional view illustrating the peripheral structure of a rotary mechanism of a process furnace of a substrate processing apparatus according to a sixth embodiment of the present invention.
Figure 8B:
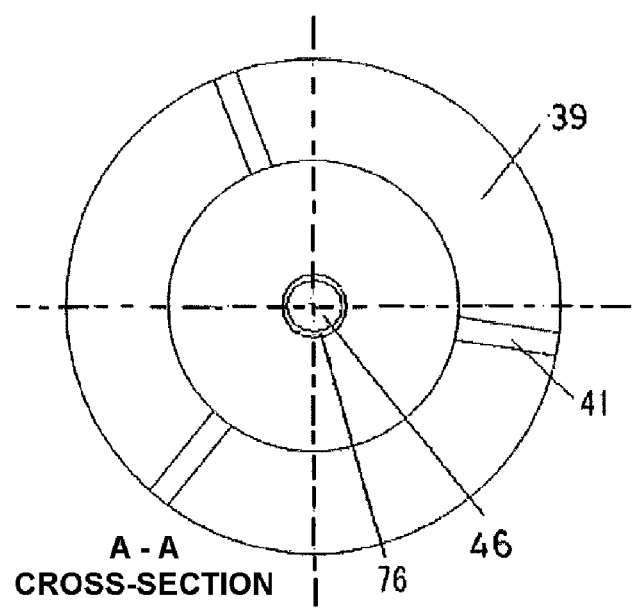
FIG. 8B is a sectional view taken along line A-A of FIG. 8A.

FIG. 8A and FIG. 8B illustrate a sixth embodiment. In the current embodiment, as second ejection ports, grooves 41 are formed in the top surface of a boat stage board 39 in three radial directions. A second gas stagnant part is a region constituted by: a disk-shaped bag hole 54 formed in a boat bottom plate 24; a key hole 55 through which the bag hole 54 is opened; a space (corresponding to the second gap 76 of the first embodiment) surrounded by a boat stage board 39 and a boat locking shaft 46; and a space (corresponding to the second gas stagnant part 74 of the first embodiment) surrounded by an outer rotation shaft 36, a rotation shaft 255, the boat stage board 39, and the boat locking shaft 46. Preferably, the grooves 41 are formed in the top surface of the boat stage board 39 with the same pitch in the circumferential direction, and the sizes of the second ejection ports are equal. Owing to this structure, the amounts and flow velocities of gas supplied into the process chamber 201 through the grooves 41 can be equal.

In the current embodiment, the same effects as the first embodiment can be obtained. In addition, the first and second modified versions of the first embodiment can be applied to the current embodiment. Furthermore, in the current embodiment, by adjusting the sizes (inner diameters and lengths) or the number of the grooves 41 formed as second ejection ports, the insides of the bag hole 54 and the key hole 55 can be purged to a sufficient level. Therefore, corrosion of a locking plate 50 made of a metal can be prevented more surely. The grooves 41 may be formed in the boat stage board 39 or the boat bottom plate 24. In the current embodiment, the second ejection ports are not limited to the grooves 41. For example, the second ejections ports may be constituted by holes formed in the boat stage board 39 or the boat bottom plate 24.

Seventh Embodiment

Figure 9A:
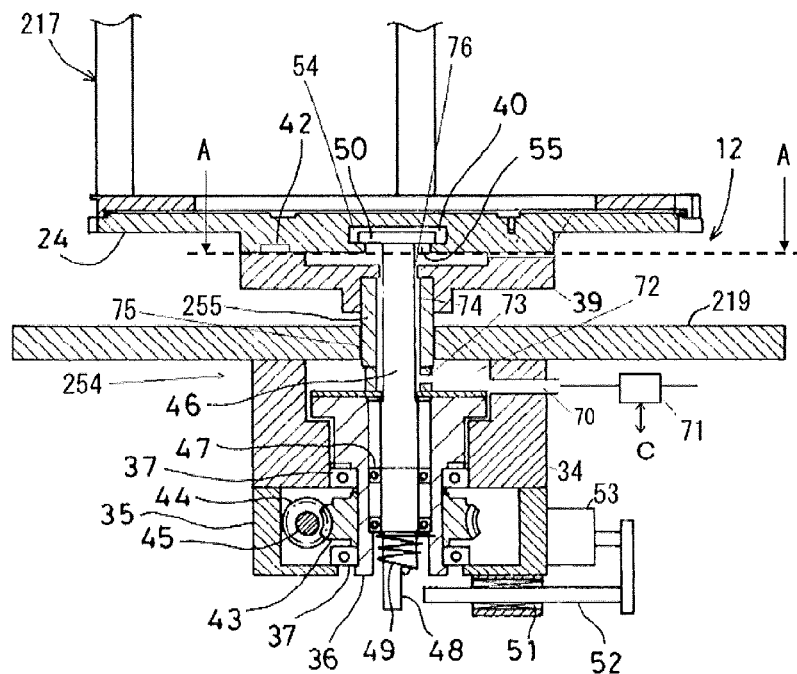
FIG. 9A is an enlarged sectional view illustrating the peripheral structure of a rotary mechanism of a process furnace of a substrate processing apparatus according to a seventh embodiment of the present invention.
Figure 9B:
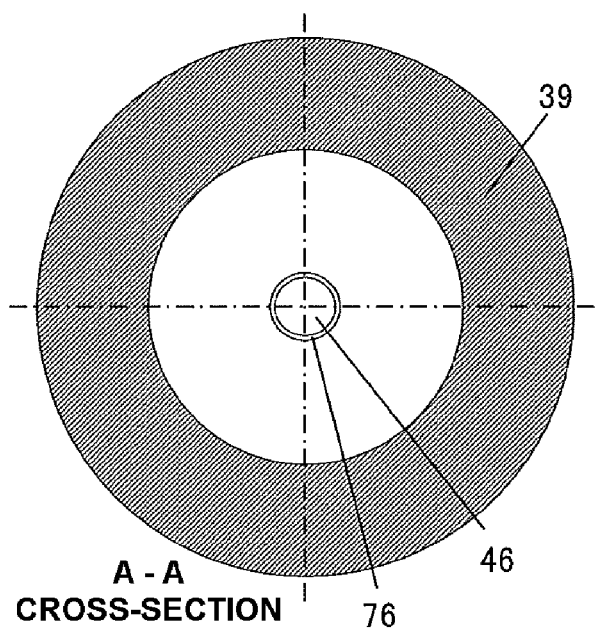
FIG. 9B is a sectional view taken along line A-A of FIG. 9A.

The current embodiment is a modified version of the sixth embodiment. FIG. 9A and FIG. 9B illustrate the seventh embodiment. The current embodiment is different from the sixth embodiment illustrated FIG. 8A and FIG. 8B, in that grooves 41 are not formed. The rest features of the current embodiment are similar to the sixth embodiment, in that a boat 217 is installed by directly contacting the bottom surface of a boat bottom plate 24 with the top surface of a boat stage board 39. In this structure, due to the difference between the profile irregularity (flatness or surface roughness) of the top surface of the boat stage board 39 and the profile irregularity (flatness or surface roughness) of the bottom surface of the boat bottom plate 24, a gap is formed between the boat stage board 39 and the boat bottom plate 24. In the current embodiment, instead of forming grooves 41, the gap formed between the boat stage board 39 and the boat bottom plate 24 is used as a second ejection port. In this point, the current embodiment is different from the sixth embodiment.

In the current embodiment, the same effects as the first embodiment can be obtained. In addition, the first and second modified versions of the first embodiment can be applied to the current embodiment. Furthermore, in the current embodiment, by adjusting the profile irregularity of the top surface of the boat stage board 39 or the bottom surface of the boat bottom plate 24, the insides of a bag hole 54 and a key hole 55 can be purged to a sufficient level. Furthermore, according to the current embodiment, it is unnecessary to form grooves 41 at the boat stage board 39 or the boat bottom plate 24, and a complicated process is unnecessary for the boat stage board 39 or the boat bottom plate 24. Therefore, the manufacturing costs of a substrate processing apparatus can be reduced.

Eighth Embodiment

In the current embodiment, so as to make the amount of purge gas ejected through a second ejection port 76 greater than the amount of purge gas ejected through a first ejection port 75, the sectional area of the second ejection port 76 is set to be greater than that of the first ejection port 75. In addition, the sectional area of the second ejection port 76 may not be determined according to the inside temperature or pressure of a process furnace 202 but determined in a manner such that purge gas can be ejected through the second ejection port 76 without fail.

In the current embodiment, the same effects as the first embodiment can be obtained. In addition, the first and second modified versions of the first embodiment can be applied to the current embodiment. Furthermore, by making the amount of purge gas ejected through the second ejection port 76 greater than the amount of purge gas ejected through the first ejection port 75, or surely ejecting purge gas through the second ejection port 76 regardless of the inside temperature or pressure of the process furnace 202, contamination of a locking plate 50 can be suppressed more reliably. As a result, the locking plate 50 can be made of a material that is less corrosion-resistant and expensive than a currently used material, and thus the manufacturing costs of a substrate processing apparatus can be reduced.

Ninth Embodiment

In the modified versions of the first embodiment, by structurally adjusting the volumes of the second gas stagnant part 74, the second gap 76, the first gas stagnant part 72, the first gap 75, and the flow ports 73, the flow velocity of purge gas ejected through the first gap 75 and the flow velocity of purge gas ejected through the second gap 76 are controlled.

However, according to the current embodiment, instead of structurally adjusting the volumes of a second gas stagnant part 74, a second gap 76, a first gas stagnant part 72, a first gap 75, and flow ports 73, a gas flowrate control unit 235 (gas regulating unit) is used to control the flow velocity of purge gas ejected through the first gap 75 and the flow velocity of purge gas ejected through the second gap 76.

Figure 10:
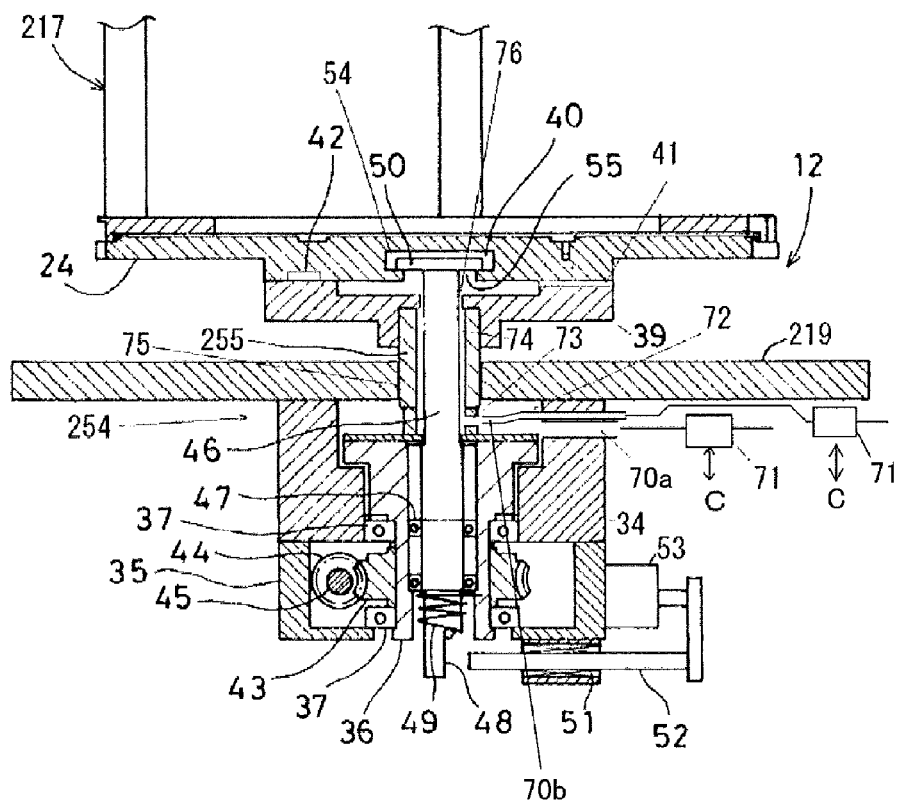
FIG. 10 is an enlarged sectional view illustrating the peripheral structure of a rotary mechanism of a process furnace of a substrate processing apparatus according to a ninth embodiment of the present invention.

In detail, as shown in FIG. 10, in addition to a gas supply part 70a configured to supply gas to the first gas stagnant part 72, a gas supply part 70b is installed at a position close to the flow ports 73 than the gas supply part 70a. That is, a plurality of gas supply parts are installed at different positions from the flow ports 73. In addition, an inert gas supply system (not shown) is connected to a gas supply line of an upstream side of the gas supply part 70b with an MFC 711 being disposed therebetween. By making the opened area of the MFC 711 greater than the opened area of an MFC 71, the flowrate of gas supplied through the gas supply part 70b can be increased higher than the flowrate of gas supplied through the gas supply part 70a. On the other hand, by making the opened area of the MFC 711 smaller than the opened area of an MFC 71, the flowrate of gas supplied through the gas supply part 70b can be decreased lower than the flowrate of gas supplied through the gas supply part 70a so as to decrease the flowrate of gas ejected through the second gap 76. Therefore, by adjusting the opened area of the MFC 711 and the opened area of the MFC 71 using the gas flowrate control unit 235 (gas regulating unit), gas supplied from the gas supply part 70 can be ejected for a predetermined time period through the first gap 75 by a first amount and through the second gap 76 by a second amount equal to or greater than the first amount.

In addition, the gas supply line connected to the gas supply part 70b and a gas supply line connected to the gas supply part 70a may be connected to each other at the upstream sides of the MFC 711 and the MFC 71, and then may be connected to a single inert gas supply source. Furthermore, the MFC 711 may not be installed. In this case, after making the opened area of the gas supply part 70b greater than the opened area of the gas supply part 70a, the opened area of the MFC 71 may be controlled by using the gas flowrate control unit 235 so as to make the flowrate of gas supplied through the gas supply part 70b greater than the flowrate of gas supplied through the gas supply part 70a.

In the current embodiment, the same effects as the first embodiment can be obtained. In addition, the first to eighth embodiments can be applied to the current embodiment.

According to an embodiment of the present invention, there is provided a substrate processing apparatus comprising: a process chamber configured to process a substrate; a substrate holder configured to hold the substrate; a cover part configured to close and open the process chamber while loading and unloading the substrate holder into and from the process chamber; a substrate holder stage configured to place the substrate holder thereon and of which at least a part is made of a metal; a rotary mechanism installed at a side of the cover part opposite to the process chamber so as to rotate the substrate holder stage; a rotation shaft inserted through the cover part and connected to the substrate holder stage and the rotary mechanism so that a first gas ejection port is formed between the rotation shaft and the cover part; a first gas stagnant part surrounded by at least the rotary mechanism and the rotation shaft, the first gas stagnant part communicating with the process chamber via the first gas ejection port; a second gas ejection port formed at the substrate holder stage; a second gas stagnant part formed at least at the rotation shaft and communicating with the process chamber via the second gas ejection port; and a flow port formed at the rotation shaft for connecting the first gas stagnant part and the second gas stagnant part, wherein the second gas stagnant part and the second gas ejection port are sized such that the ratio of the volume of the second gas stagnant part to the volume of the second gas ejection port is equal to or greater than the ratio of the volume of the first gas stagnant part to the sum of the volumes of the first gas ejection port and the flow port. Therefore, corrosion of metallic surfaces and contamination of substrates can be suppressed, and process quality and yield can be improved.

According to another embodiment of the present invention, there is provided a substrate processing apparatus comprising: a process chamber configured to process a substrate; a substrate holder configured to hold the substrate; a cover part configured to close and open the process chamber while loading and unloading the substrate holder into and from the process chamber; a substrate holder stage configured to place the substrate holder thereon and of which at least a part is made of a metal; a rotary mechanism installed at a side of the cover part opposite to the process chamber so as to rotate the substrate holder stage; a gas supply part configured to supply gas to the rotary mechanism; a rotation shaft inserted through the cover part and connected to the substrate holder stage and the rotary mechanism; a first gas ejection port formed between the cover part and the rotation shaft and configured to supply gas from the gas supply part to an inside of the process chamber; a second gas ejection port formed between the substrate holder stage and the substrate holder in a state where the substrate holder is placed on the substrate holder stage, so as to supply gas from the gas supply part to the inside of the process chamber; and a gas regulating unit configured to perform a regulating operation so that gas supplied from the gas supply part is ejected for a predetermined time period through the first gas ejection port by a first amount and through the second gas ejection port by a second amount equal to or greater than the first amount. Therefore, corrosion of metallic surfaces and contamination of substrates can be suppressed, and process quality and yield can be improved.

According to another embodiment of the present invention, there is provided a method of manufacturing a semiconductor device by using the substrate processing apparatus, the method comprising: a process of placing the substrate holder in which a substrate is held on the substrate holder stage, loading the substrate holder into the process chamber, and closing the process chamber by using the cover part; and a process of processing the substrate in the process chamber by rotating the substrate holder by rotating the rotation shaft using the rotary mechanism, supplying gas to an inside of the first gas stagnant part, ejecting some of the gas supplied to the inside of the first gas stagnant part into the process chamber through the first gas ejection port, and ejecting at least the rest of the gas supplied to the first gas stagnant part into the process chamber through the flow port, the second gas stagnant part, and the second gas ejection port. Therefore, corrosion of metallic surfaces and contamination of substrates can be suppressed, and process quality and yield can be improved.

According to another embodiment of the present invention, there is provided a method of manufacturing a semiconductor device by using the substrate processing apparatus, the method comprising: a process of placing the substrate holder in which a substrate is held on the substrate holder stage, loading the substrate holder into the process chamber, and closing the process chamber by using the cover part; and a process of processing the substrate in the process chamber by rotating the rotation shaft using the rotary mechanism, ejecting some of gas supplied to the rotary mechanism into the process chamber through the first gas ejection port by a first amount for a predetermined time period, and ejecting at least the rest of the gas supplied to the rotary mechanism into the process chamber through the second gas ejection port by a second amount equal to or greater than the first amount for the predetermined time period. Therefore, corrosion of metallic surfaces and contamination of substrates can be suppressed, and process quality and yield can be improved.

According to another embodiment of the present invention, there is provided a method of manufacturing a semiconductor device, the method comprising: a process of placing a substrate holder in which a substrate is held on a substrate holder stage of which at least a part is made of a metal, loading the substrate holder into a process chamber, and closing the process chamber by using a cover part; and a process of processing the substrate in the process chamber by: rotating a rotation shaft, which is inserted through the cover part and connected to the substrate holder stage so that a first gas ejection port is formed between the rotation shaft and the cover part, by using a rotary mechanism installed at a side of the cover part opposite to the process chamber; ejecting some of gas supplied to the rotary mechanism into the process chamber through the first gas ejection port by a first amount for a predetermined time period; and ejecting at least the rest of the gas supplied to the rotary mechanism into the process chamber through a second gas ejection port formed at the substrate holder stage by a second amount equal to or greater than the first amount for the predetermined time period. Therefore, corrosion of metallic surfaces and contamination of substrates can be suppressed, and process quality and yield can be improved.

(Supplementary Note)

The present invention also includes the following embodiments.

(Supplementary Note 1)

According to an embodiment of the present invention, there is provided a substrate processing apparatus comprising:

a process chamber configured to process a substrate;

a substrate holder configured to hold the substrate;

a cover part configured to close and open the process chamber while loading and unloading the substrate holder into and from the process chamber;

a substrate holder stage configured to place the substrate holder thereon and of which at least a part is made of a metal;

a rotary mechanism installed at a side of the cover part opposite to the process chamber so as to rotate the substrate holder stage;

a rotation shaft inserted through the cover part and connected to the substrate holder stage and the rotary mechanism so that a first gas ejection port is formed between the rotation shaft and the cover part;

a first gas stagnant part surrounded by the rotary mechanism, the cover part, and the rotation shaft, the first gas stagnant part communicating with the process chamber via the first gas ejection port;

a second gas ejection port formed at the substrate holder stage;

a second gas stagnant part formed at the rotation shaft and communicating with the process chamber via the second gas ejection port; and a flow port formed at the rotation shaft for connecting the first gas stagnant part and the second gas stagnant part, wherein the second gas stagnant part and the second gas ejection port are sized such that the ratio of the volume of the second gas stagnant part to the volume of the second gas ejection port is equal to or greater than the ratio of the volume of the first gas stagnant part to the sum of the volumes of the first gas ejection port and the flow port.

(Supplementary Note 2)

According to another embodiment of the present invention, there is provided a substrate processing apparatus comprising:

a process chamber configured to process a substrate;

a substrate holder configured to hold the substrate;

a cover part configured to close and open the process chamber while loading and unloading the substrate holder into and from the process chamber;

a substrate holder stage configured to place the substrate holder thereon and of which at least a part is made of a metal;

a rotary mechanism installed at a side of the cover part opposite to the process chamber so as to rotate the substrate holder stage;

a rotation shaft inserted through the cover part and connected to the substrate holder stage and the rotary mechanism so that a first gas ejection port is formed between the rotation shaft and the cover part;

a first gas stagnant part surrounded by at least the rotary mechanism and the rotation shaft, the first gas stagnant part communicating with the process chamber via the first gas ejection port;

a second gas ejection port formed at the substrate holder stage;

a second gas stagnant part formed at least at the rotation shaft and communicating with the process chamber via the second gas ejection port; and a flow port formed at the rotation shaft for connecting the first gas stagnant part and the second gas stagnant part, wherein the second gas stagnant part and the second gas ejection port are sized such that the ratio of the volume of the second gas stagnant part to the volume of the second gas ejection port is equal to or greater than the ratio of the volume of the first gas stagnant part to the sum of the volumes of the first gas ejection port and the flow port.

(Supplementary Note 3)

According to another embodiment of the present invention, there is provided a substrate processing apparatus comprising:

a process chamber configured to process a substrate;

a substrate holder configured to hold the substrate;

a cover part configured to close and open the process chamber while loading and unloading the substrate holder into and from the process chamber;

a substrate holder stage configured to place the substrate holder thereon and of which at least a part is made of a metal;

a rotary mechanism installed at a side of the cover part opposite to the process chamber so as to rotate the substrate holder stage;

a gas supply part configured to supply gas to the rotary mechanism;

a rotation shaft inserted through the cover part and connected to the substrate holder stage and the rotary mechanism;

a first gas ejection port formed between the cover part and the rotation shaft and configured to supply gas from the gas supply part to an inside of the process chamber;

a second gas ejection port formed between the substrate holder stage and the substrate holder in a state where the substrate holder is placed on the substrate holder stage, so as to supply gas from the gas supply part to the inside of the process chamber; and a gas regulating unit configured to perform a regulating operation so that gas supplied from the gas supply part is ejected for a predetermined time period through the first gas ejection port by a first amount and through the second gas ejection port by a second amount equal to or greater than the first amount.

(Supplementary Note 4)

According to another embodiment of the present invention, there is provided a method of manufacturing a semiconductor device, the method comprising:

a process of placing a substrate holder in which a substrate is held on a substrate holder stage of which at least part is made of a metal and in which a second gas ejection port is formed, loading the substrate holder into a process chamber, and closing the process chamber by using a cover part; and a process of processing the substrate in the process chamber by:

rotating the substrate holder by rotating a rotation shaft using a rotary mechanism installed at a side of the cover part opposite to the process chamber, wherein the rotation shaft is inserted through the cover part such that a first gas ejection port is formed between the rotation shaft and the cover part, a second gas stagnant part communicating with the process chamber through the second gas ejection port is formed at the rotation shaft, a flow port is formed at the rotation shaft, and the rotation shaft is connected to the substrate holder stage, supplying gas to an inside of a first gas stagnant part that is surrounded by at least the rotary mechanism and the rotation shaft and communicates with the process chamber via the first gas ejection port and with the second gas stagnant part via the flow port, wherein the first gas stagnant part is configured such that the ratio of the volume of the second gas stagnant part to the volume of the second gas ejection port is equal to or greater than the ratio of the volume of the first gas stagnant part to the sum of the volumes of the first gas ejection port and the flow port, ejecting some of the gas supplied to the inside of the first gas stagnant part into the process chamber through the first gas ejection port, and ejecting at least the rest of the gas supplied to the first gas stagnant part into the process chamber through the flow port, the second gas stagnant part, and the second gas ejection port.

(Supplementary Note 5)

According to another embodiment of the present invention, there is provided a method of manufacturing a semiconductor device, the method comprising:

a process of placing a substrate holder in which a substrate is held on a substrate holder stage of which at least a part is made of a metal, loading the substrate holder into a process chamber, and closing the process chamber by using a cover part; and a process of processing the substrate in the process chamber by:

rotating the substrate holder by rotating a rotation shaft, which is inserted through the cover part and connected to the substrate holder stage so that a first gas ejection port is formed between the rotation shaft and the cover part, by using a rotary mechanism installed at a side of the cover part opposite to the process chamber;

ejecting some of gas supplied to the rotary mechanism into the process chamber through the first gas ejection port by a first amount for a predetermined time period; and ejecting at least the rest of the gas supplied to the rotary mechanism into the process chamber through a second gas ejection port formed at the substrate holder stage by a second amount equal to or greater than the first amount for the predetermined time period.

(Supplementary Note 6)

According to another embodiment of the present invention, there is provided a method of manufacturing a semiconductor device, the method comprising:

a process of loading a substrate holder into a process chamber in a state where the substrate holder holds a substrate and is placed on a substrate holder stage of which at least a part is made of a metal, and closing the process chamber by using a cover part; and a process of processing the substrate in the process chamber while:

rotating the substrate holder by rotating a rotation shaft, which is inserted through the cover part and connected to the substrate holder stage with a first gas ejection port being formed between the rotation shaft and the cover part, by using a rotary mechanism installed at a side of the cover part opposite to the process chamber;

supplying gas to a first gas stagnant part surrounded by at least the rotary mechanism and the rotation shaft;

ejecting some of the gas supplied to the first gas stagnant part into the process chamber through the first gas ejection port;

supplying the rest of the gas supplied to the first gas stagnant part to a second gas stagnant part through a flow port of the rotation shaft; and ejecting the rest of the gas from the second gas stagnant part into the process chamber through a second gas ejection port, wherein the rotation shaft includes the flow port and the gas second stagnant part that are formed at least at the rotation shaft and the second gas ejection port formed at the substrate holder stage, and the rotation shaft is configured so that the ratio of the volume of the second gas stagnant part to the volume of the second gas ejection port is equal to or greater than the ratio of the volume of the first gas stagnant part to the sum of the volumes of the first gas ejection port and the flow port.

(Supplementary Note 7)

According to another embodiment of the present invention, there is provided a method of manufacturing a semiconductor device, the method comprising:

a process of loading a substrate holder into a process chamber in a state where the substrate holder holds a substrate and is placed on a substrate holder stage of which at least a part is made of a metal, and closing the process chamber by using a cover part; and a process of processing the substrate in the process chamber while:

rotating the substrate holder by rotating a rotation shaft, which is inserted through the cover part and connected to the substrate holder stage with a first gas ejection port being formed between the rotation shaft and the cover part, by using a rotary mechanism installed at a side of the cover part opposite to the process chamber;

ejecting some of gas supplied to the rotary mechanism into the process chamber through the first gas ejection port by a first amount for a predetermined time period; and ejecting at least the rest of the gas supplied to the rotary mechanism into the process chamber through a second gas ejection port formed at the substrate holder stage by a second amount equal to or greater than the first amount for the predetermined time period.

(Supplementary Note 8)

According to another embodiment of the present invention, there is provided a method of manufacturing a semiconductor device, the method comprising:

a process of loading a substrate holder into a process chamber in a state where the substrate holder holds a substrate and is placed on a substrate holder stage of which at least a part is made of a metal, and closing the process chamber by using a cover part; and a process of processing the substrate in the process chamber while:

rotating the substrate holder by rotating a rotation shaft, which is inserted through the cover part and connected to the substrate holder stage with a first gas ejection port being formed between the rotation shaft and the cover part, by using a rotary mechanism installed at a side of the cover part opposite to the process chamber;

supplying gas to a first gas stagnant part surrounded by at least the rotary mechanism and the rotation shaft;

ejecting some of the gas supplied to the first gas stagnant part into the process chamber through the first gas ejection port;

supplying at least the rest of the gas supplied to the first gas stagnant part to a second gas stagnant part through a flow port of the rotation shaft; and ejecting the rest of the gas from the second gas stagnant part into the process chamber through a second gas ejection port, wherein the rotation shaft includes the flow port and the gas second stagnant part that are formed at the rotation shaft and the second gas ejection port formed at the substrate holder stage, and the rotation shaft is configured so that the ratio of the volume of the second gas stagnant part to the volume of the second gas ejection port is equal to or greater than the ratio of the volume of the first gas stagnant part to the sum of the volumes of the first gas ejection port and the flow port.

(Supplementary Note 9)

According to another embodiment of the present invention, there is provided a method of manufacturing a semiconductor device, the method comprising:

a process of loading a substrate holder into a process chamber in a state where the substrate holder holds a substrate and is placed on a substrate holder stage of which at least a part is made of a metal, and closing the process chamber by using a cover part; and a process of processing the substrate in the process chamber while:

rotating the substrate holder by rotating a rotation shaft, which is inserted through the cover part and connected to the substrate holder stage with a first gas ejection port being formed between the rotation shaft and the cover part, by using a rotary mechanism installed at a side of the cover part opposite to the process chamber;

supplying gas to a first gas stagnant part surrounded by at least the rotary mechanism and the rotation shaft;

ejecting some of the gas supplied to the first gas stagnant part into the process chamber through the first gas ejection port with a first flow velocity;

supplying at least the rest of the gas supplied to the first gas stagnant part to a second gas stagnant part through a flow port formed at the rotation shaft; and ejecting the rest gas from the second gas stagnant part to the process chamber through a second gas ejection port formed at the substrate holder stage with a flow velocity equal to or greater than the first flow velocity.

(Supplementary Note 10)

According to another embodiment of the present invention, there is provided a substrate processing apparatus comprising:

a process chamber configured to process a substrate;

a substrate holder configured to hold the substrate;

a cover part configured to close and open the process chamber while loading and unloading the substrate holder into and from the process chamber;

a substrate holder stage of which at least a part is made of a metal and configured to place the substrate holder thereon;

a rotary mechanism installed at a side of the cover part opposite to the process chamber so as to rotate the substrate holder stage;

a rotation shaft inserted through the cover part and connected to the substrate holder stage and the rotary mechanism so that a first gas ejection port is formed between the rotation shaft and the cover part;

a first gas stagnant part surrounded by at least the rotary mechanism and the rotation shaft, the first gas stagnant part communicating with the process chamber via the first gas ejection port;

a second gas ejection port formed at the substrate holder stage;

a second gas stagnant part formed at least at the rotation shaft and communicating with the process chamber via the second gas ejection port; and a flow port formed at the rotation shaft for connecting the first gas stagnant part and the second gas stagnant part, wherein some of gas supplied to the first gas stagnant part is ejected from the first gas stagnant part to the process chamber through the first gas ejection port with a first flow velocity, and at least the rest of the gas supplied to the first gas stagnant part is supplied from the first gas stagnant part to the second gas stagnant part through the flow port and is ejected from the second gas stagnant part to the process chamber through the second gas ejection port with a flow velocity equal to or greater than the first flow velocity.

(Supplementary Note 11)

The substrate processing apparatus of Supplementary Note 1 may further include a locking shaft configured to lock the substrate holder rotated relative to the rotation shaft, wherein the first gas stagnant part may be surrounded by the rotation shaft and the locking shaft, and the second gas ejection port may be formed at least between the substrate holder and the locking shaft.

(Supplementary Note 12)

According to another embodiment of the present invention, there is provided a method of manufacturing a semiconductor device, the method comprising:

a process of placing a substrate holder in which a substrate is held on a substrate holder stage of which at least a part is made of a metal, loading the substrate holder into a process chamber in a state where a locking shaft is rotated relative to a rotation shaft to prevent falling the substrate holder, and closing the process chamber using a cover part; and a process of processing the substrate in the process chamber while:

rotating the substrate holder by rotating a rotation shaft, which is inserted through the cover part and connected to the substrate holder stage with a first gas ejection port being formed between the rotation shaft and the cover part, by using a rotary mechanism installed at a side of the cover part opposite to the process chamber;

supplying gas to a first gas stagnant part surrounded by at least the rotary mechanism and the rotation shaft;

ejecting some of the gas supplied to the first gas stagnant part into the process chamber through the first gas ejection port;

supplying at least the rest of the gas supplied to the first gas stagnant part to a second gas stagnant part through a flow port of the rotation shaft; and ejecting the rest of the gas from the second gas stagnant part into the process chamber through a second gas ejection port, wherein the rotation shaft includes the flow port and the second stagnant part that are formed between the rotation shaft and the locking shaft, and the second gas ejection port formed between at least the substrate holder stage and the locking shaft, and the rotation shaft is configured so that the ratio of the volume of the second gas stagnant part to the volume of the second gas ejection port is equal to or greater than the ratio of the volume of the first gas stagnant part to the sum of the volumes of the first gas ejection port and the flow port.

(Supplementary Note 13)

According to another embodiment of the present invention, there is provided a substrate processing apparatus comprising: a process chamber configured to process a substrate; a substrate holder configured to hold the substrate; a cover part configured to close and open the process chamber while loading and unloading the substrate holder into and from the process chamber; a substrate holder stage configured to place the substrate holder thereon and of which at least a part is made of a metal; a rotary mechanism installed at a side of the cover part opposite to the process chamber so as to rotate the substrate holder stage; a rotation shaft inserted through the cover part and connected to the substrate holder stage and the rotary mechanism so that a first gas ejection port is formed between the rotation shaft and the cover part; a first gas stagnant part surrounded by the rotary mechanism, the cover part, and the rotation part, the first gas stagnant part communicating with the process chamber via the first gas ejection port; a second gas ejection port formed at the substrate holder stage; a second gas stagnant part formed at the rotation shaft and communicating with the process chamber via the second gas ejection port; and a flow port formed at the rotation shaft for connecting the first gas stagnant part and the second gas stagnant part, wherein the second gas stagnant part and the second gas ejection port are sized such that the ratio of the volume of the second gas stagnant part to the volume of the second gas ejection port is equal to or greater than the ratio of the volume of the first gas stagnant part to the sum of the volumes of the first gas ejection port and the flow port.

(Supplementary Note 14)

The substrate processing apparatus of Supplementary Note 1 may further include a locking shaft configured to lock the substrate holder rotated relative to the rotation shaft, wherein the first gas stagnant part may be surrounded by the rotation shaft and the locking shaft, and the second gas ejection port may be formed at least between the substrate holder and the locking shaft.

(Supplementary Note 15)

According to another embodiment of the present invention, there is provided a method of manufacturing a semiconductor device, the method comprising:

a process of loading a substrate holder into a process chamber in a state where the substrate holder holds a substrate and is placed on a substrate holder stage of which at least a part is made of a metal, and closing the process chamber by using a cover part; and a process of processing the substrate in the process chamber while: rotating the substrate holder by rotating a rotation shaft, which is inserted through the cover part and connected to the substrate holder stage with a first gas ejection port being formed between the rotation shaft and the cover part, by using a rotary mechanism installed at a side of the cover part opposite to the process chamber; supplying gas to a first gas stagnant part surrounded by the rotary mechanism, the cover part, and the rotation shaft; ejecting some of the gas supplied to the first gas stagnant part into the process chamber through the first gas ejection port; supplying the rest of the gas supplied to the first gas stagnant part to a second gas stagnant part through a flow port of the rotation shaft; and ejecting the rest of the gas from the second gas stagnant part into the process chamber through a second gas ejection port, wherein the rotation shaft includes the flow port and the gas second stagnant part that are formed at the rotation shaft and the second gas ejection port formed at the substrate holder stage, and the rotation shaft is configured so that the ratio of the volume of the second gas stagnant part to the volume of the second gas ejection port is equal to or greater than the ratio of the volume of the first gas stagnant part to the sum of the volumes of the first gas ejection port and the flow port.

(Supplementary Note 16)

According to another embodiment of the present invention, there is provided a method of manufacturing a semiconductor device, the method comprising:

a process of placing a substrate holder in which a substrate is held on a substrate holder stage of which at least a part is made of a metal, loading the substrate holder into a process chamber in a state where a locking shaft is rotated relative to a rotation shaft to prevent falling the substrate holder, and closing the process chamber using a cover part; and a process of processing the substrate in the process chamber while: rotating the substrate holder by rotating a rotation shaft, which is inserted through the cover part and connected to the substrate holder stage with a first gas ejection port being formed between the rotation shaft and the cover part, by using a rotary mechanism installed at a side of the cover part opposite to the process chamber; supplying gas to a first gas stagnant part surrounded by the rotary mechanism, the cover part, and the rotation shaft; ejecting some of the gas supplied to the first gas stagnant part into the process chamber through the first gas ejection port; supplying the rest of the gas supplied to the first gas stagnant part to a second gas stagnant part through a flow port of the rotation shaft; and ejecting the rest of the gas from the second gas stagnant part into the process chamber through a second gas ejection port, wherein the rotation shaft includes the flow port and the second stagnant part that are formed between the rotation shaft and the locking shaft, and the second gas ejection port formed between at least the substrate holder stage and the locking shaft, and the rotation shaft is configured so that the ratio of the volume of the second gas stagnant part to the volume of the second gas ejection port is equal to or greater than the ratio of the volume of the first gas stagnant part to the sum of the volumes of the first gas ejection port and the flow port.

(Supplementary Note 17)

According to another embodiment of the present invention, there is provided a method of manufacturing a semiconductor device, the method comprising:

a process of loading a substrate holder into a process chamber in a state where the substrate holder holds a substrate and is placed on a substrate holder stage of which at least a part is made of a metal, and closing the process chamber by using a cover part; and a process of processing the substrate in the process chamber while: rotating the substrate holder by rotating a rotation shaft, which is inserted through the cover part and connected to the substrate holder stage with a first gas ejection port being formed between the rotation shaft and the cover part, by using a rotary mechanism installed at a side of the cover part opposite to the process chamber; supplying gas to a first gas stagnant part surrounded by the rotary mechanism, the cover part, and the rotation shaft; ejecting some of the gas supplied to the first gas stagnant part into the process chamber through the first gas ejection port with a first flow velocity; supplying the rest of the gas supplied to the first gas stagnant part to a second gas stagnant part through a flow port formed at the rotation shaft; and ejecting the rest gas from the second gas stagnant part to the process chamber through a second gas ejection port formed at the substrate holder stage with a flow velocity equal to or greater than the first flow velocity.

What is claimed is:

1. A substrate processing apparatus comprising:
a process chamber configured to process a substrate;
a substrate holder configured to hold the substrate;
a cover part having a first penetration hole extending from an inside to an outside of the process chamber, the cover part configured to close and open the process chamber while loading and unloading the substrate holder into and from the process chamber;
a substrate holder stage whereon the substrate holder is placed,
wherein at least a portion of the substrate holder stage is made of a metal;
a rotary mechanism installed at a side of the cover part opposite to the process chamber so as to rotate the substrate holder stage;
a rotation shaft inserted through the first penetration hole and connected to the substrate holder stage and the rotary mechanism;
a first gas ejection port defined by an inner circumferential surface of the cover part and the rotation shaft;
a first gas stagnant part surrounded by the rotary mechanism, the rotation shaft and the cover part, the first gas stagnant part communicating with the process chamber via the first gas ejection port;
a second gas ejection port comprising at least a second penetration hole extending from a surface of the substrate holder stage whereon the substrate holder is placed to an opposite surface thereof facing the rotary mechanism;
a second gas stagnant part disposed at the rotation shaft and communicating with the process chamber via the second gas ejection port; and
a flow port disposed at the rotation shaft, the flow part connecting the first gas stagnant part and the second gas stagnant part,
wherein a ratio of a volume of the second gas stagnant part to that of the second gas ejection port is equal to or greater than a ratio of a volume of the first gas stagnant part to a sum of volumes of the first gas ejection port and the flow port.

2. The substrate processing apparatus of claim 1, further comprising a locking shaft inserted through the rotation shaft, the locking shaft being configured to lock the substrate holder and rotate relative to the rotation shaft, wherein the second gas stagnant part is disposed between the rotation shaft and the locking shaft, and wherein the second gas ejection port is disposed at least between an inner circumferential surface of the substrate holder stage and the locking shaft.

3. The substrate processing apparatus of claim 1, wherein some of gas supplied to the first gas stagnant part is ejected from the first gas stagnant part to the process chamber through the first gas ejection port with a first flow velocity, and wherein at least the rest of the gas supplied to the first gas stagnant part is supplied from the first gas stagnant part to the second gas stagnant part through the flow port and is ejected from the second gas stagnant part to the process chamber through the second gas ejection port with a flow velocity equal to or greater than the first flow velocity.

4. A substrate processing apparatus comprising:
a process chamber configured to process a substrate;
a substrate holder configured to hold the substrate;
a cover part having a first penetration hole extending from an inside to an outside of the process chamber, the cover part configured to close and open the process chamber while loading and unloading the substrate holder into and from the process chamber;
a substrate holder stage whereon the substrate holder is placed, wherein at least a portion of the substrate holder stage is made of a metal;
a rotary mechanism installed at a side of the cover part opposite to the process chamber so as to rotate the substrate holder stage;
a rotation shaft inserted through the first penetration hole and connected to the substrate holder stage and the rotary mechanism;
a first gas ejection port defined by an inner circumferential surface of the cover part and the rotation shaft;
a first gas stagnant part surrounded by the rotary mechanism, the cover part and the rotation shaft, the first gas stagnant part communicating with the process chamber via the first gas ejection port;
a second gas ejection port comprising at least a second penetration hole extending from a surface of the substrate holder stage whereon the substrate holder is placed to an opposite surface thereof facing the rotary mechanism;
a second gas stagnant part disposed at the rotation shaft and communicating with the process chamber via the second gas ejection port; and
a flow port disposed at the rotation shaft, the flow part connecting the first gas stagnant part and the second gas stagnant part.

5. The substrate processing apparatus of claim 4, further comprising:
a locking shaft inserted through the rotation shaft, the locking shaft being configured to lock the substrate holder and rotate relative to the rotation shaft,
wherein the second gas stagnant part is disposed between the rotation shaft and the locking shaft, and
wherein the second gas ejection port is disposed at least between an inner circumferential surface of the substrate holder stage and the locking shaft.

6. A substrate processing apparatus comprising:
a process chamber configured to process a substrate;
a substrate holder configured to hold the substrate;
a cover part having a first penetration hole extending from an inside to an outside of the process chamber, the cover part configured to close and open the process chamber while loading and unloading the substrate holder into and from the process chamber;
a substrate holder stage whereon the substrate holder is placed, wherein at least a portion of the substrate holder stage is made of a metal;
a rotary mechanism installed at a side of the cover part opposite to the process chamber so as to rotate the substrate holder stage;
a rotation shaft inserted through the first penetration hole and connected to the substrate holder stage and the rotary mechanism;
a first gas ejection port defined by an inner circumferential surface of the cover part and the rotation shaft;
a first gas stagnant part surrounded by the rotary mechanism, the cover part and the rotation shaft, the first gas stagnant part communicating with the process chamber via the first gas ejection port;
a second penetration hole extending from a surface of the substrate holder stage whereon the substrate holder is placed to an opposite surface thereof facing the rotary mechanism;
a second gas ejection port disposed at an upper side of the rotation shaft and communicating with the second penetration hole;
a second gas stagnant part disposed at the rotation shaft and communicating with the process chamber via the second gas ejection port; and
a flow port disposed at the rotation shaft, the flow part connecting the first gas stagnant part and the second gas stagnant part.

7. The substrate processing apparatus of claim 6, further comprising:
a locking shaft inserted through the rotation shaft, the locking shaft being configured to lock the substrate holder and rotate relative to the rotation shaft,
wherein the second gas stagnant part is disposed between the rotation shaft and the locking shaft, and
wherein the second gas ejection port is disposed at least between an inner circumferential surface of the substrate holder stage and the locking shaft.

\* \* \* \* \*